United States Patent
Azar et al.

(10) Patent No.: US 10,692,798 B2
(45) Date of Patent: Jun. 23, 2020

(54) MULTIPLE FLOW ENTRANCE HEAT SINK

(71) Applicant: Advanced Thermal Solutions, Inc., Norwood, MA (US)

(72) Inventors: Kaveh Azar, Quincy, MA (US); Bahman Tavassoli-Hojati, Norton, MA (US)

(73) Assignee: Advanced Thermal Solutions, Inc., Norwood, MA (US)

( * ) Notice: Subject to any disclaimer, the term of this patent is extended or adjusted under 35 U.S.C. 154(b) by 301 days.

(21) Appl. No.: 14/682,727

(22) Filed: Apr. 9, 2015

(65) Prior Publication Data
US 2015/0296662 A1      Oct. 15, 2015

Related U.S. Application Data

(60) Provisional application No. 61/978,129, filed on Apr. 10, 2014.

(51) Int. Cl.
| | |
|---|---|
| *H01L 23/467* | (2006.01) |
| *F28F 3/02* | (2006.01) |
| *H05K 7/20* | (2006.01) |
| *F28D 21/00* | (2006.01) |
| *H01L 23/367* | (2006.01) |
| *F28F 3/06* | (2006.01) |
| *H01L 21/48* | (2006.01) |

(52) U.S. Cl.
CPC ............ *H01L 23/467* (2013.01); *F28F 3/02* (2013.01); *H01L 23/3672* (2013.01); *H05K 7/20* (2013.01); *F28D 2021/0029* (2013.01); *F28F 3/06* (2013.01); *F28F 2215/04* (2013.01); *H01L 21/4871* (2013.01); *H01L 21/4882* (2013.01); *H01L 2924/0002* (2013.01)

(58) Field of Classification Search
CPC ........... H01L 23/467; H01L 2924/0002; H01L 21/4871; H01L 21/4882; H01L 23/3677; F28F 3/06; F28F 3/02; H05K 7/20; H05K 7/209; H05K 7/20163; H05K 7/2039; F28D 2021/0029; H01C 23/3677; H01C 1/084

See application file for complete search history.

(56) References Cited

U.S. PATENT DOCUMENTS

| | | | | |
|---|---|---|---|---|
| 5,253,702 | A * | 10/1993 | Davidson | F28D 15/0233 165/80.4 |
| 5,329,993 | A * | 7/1994 | Ettehadieh | F28D 15/0233 165/104.14 |
| 5,484,262 | A * | 1/1996 | Thomas | F04D 29/582 165/125 |

(Continued)

FOREIGN PATENT DOCUMENTS

| | | | | |
|---|---|---|---|---|
| WO | WO-2005006435 A1 * | 1/2005 | | H01L 23/3672 |
| WO | WO 2015157523 A1 * | 10/2015 | | H01L 23/467 |
| WO | WO-2016148065 A1 * | 9/2016 | | B21D 53/04 |

*Primary Examiner* — Jianying C Atkisson
*Assistant Examiner* — Miguel A Diaz
(74) *Attorney, Agent, or Firm* — Lieberman & Brandsdorfer, LLC

(57) ABSTRACT

Embodiments of the invention related to using the fin length of the heat sink extending from an entrance of the heat sink to an interior sectional wall as the heat transfer element to achieve high thermal performance. The sectional wall(s) of the heat sink function to isolate fluid flow communication between the heat sink sections of fin fields, thereby preventing a flow coupling between the fin fields.

20 Claims, 15 Drawing Sheets

(56) References Cited

U.S. PATENT DOCUMENTS

| | | | | |
|---|---|---|---|---|
| 5,704,419 A * | 1/1998 | Agonafer | ................... | F28F 3/12 165/121 |
| 5,740,014 A * | 4/1998 | Lin | ...................... | H01L 23/467 165/121 |
| 5,995,367 A * | 11/1999 | Smith | ................... | H01L 23/467 165/78 |
| 6,222,731 B1 * | 4/2001 | Katsui | .................... | H01L 23/40 165/121 |
| 6,407,919 B1 * | 6/2002 | Chou | ................... | H01L 23/467 174/16.3 |
| 6,411,508 B1 * | 6/2002 | Kang | ................... | H01L 23/3733 165/185 |
| 6,418,020 B1 * | 7/2002 | Lin | ...................... | H01L 23/367 165/80.3 |
| 6,424,529 B2 * | 7/2002 | Eesley | ...................... | F28F 3/02 165/80.3 |
| 6,424,531 B1 * | 7/2002 | Bhatti | ...................... | F28F 3/02 165/185 |
| 6,442,045 B1 * | 8/2002 | Goodwin | ............ | H05K 7/1084 174/382 |
| 6,547,540 B1 * | 4/2003 | Horng | ................. | F04D 25/0613 361/695 |
| 6,626,233 B1 * | 9/2003 | Connors | ............. | F28D 15/0233 165/104.33 |
| 6,671,172 B2 * | 12/2003 | Carter | ................ | H01L 23/3672 165/121 |
| 6,672,374 B1 * | 1/2004 | Lin | ...................... | H01L 23/4093 165/121 |
| D491,260 S * | 6/2004 | Luo | .............. | D23/411 |
| 6,761,211 B2 * | 7/2004 | Bhatti | ...................... | F28F 3/02 165/185 |
| D500,745 S * | 1/2005 | Duan | .................... | D13/179 |
| 6,840,307 B2 * | 1/2005 | Eesley | ...................... | F28F 3/02 165/185 |
| 6,924,982 B2 * | 8/2005 | Chen | ................... | H01L 23/4093 165/185 |
| 6,924,983 B2 * | 8/2005 | Otsuki | ................... | H01L 23/467 165/104.33 |
| D509,485 S * | 9/2005 | Mochizuki | .................... | D13/179 |
| 6,945,319 B1 * | 9/2005 | Li | ...................... | F28D 15/0275 165/104.33 |
| 6,958,912 B2 * | 10/2005 | Pokharna | .............. | H01L 23/427 165/185 |
| 6,972,950 B1 * | 12/2005 | Wyatt | ...................... | G06F 1/203 165/104.33 |
| 7,046,515 B1 * | 5/2006 | Wyatt | ...................... | G06F 1/203 165/121 |
| 7,059,391 B2 * | 6/2006 | Whitney | ............. | F28D 15/0233 165/104.21 |
| 7,113,403 B2 * | 9/2006 | Kuo | ................... | H01L 23/467 165/121 |
| 7,152,666 B2 * | 12/2006 | Chen | ................... | H01L 23/467 165/80.3 |
| 7,395,851 B2 * | 7/2008 | Lee | ................... | H01L 23/427 165/104.33 |
| 7,433,189 B2 * | 10/2008 | Chen | ........................ | G06F 1/20 165/104.33 |
| D589,003 S * | 3/2009 | Huang | ........................ | D13/179 |
| 7,556,087 B2 * | 7/2009 | Hung | ................... | H01L 23/467 165/122 |
| 7,564,687 B2 * | 7/2009 | Liu | .................... | H01L 23/4093 165/185 |
| 7,567,435 B2 * | 7/2009 | Azar | ................... | H01L 23/4093 361/679.54 |
| 7,583,503 B2 * | 9/2009 | Lin | ...................... | H01L 23/40 165/80.3 |
| 7,619,892 B2 * | 11/2009 | Liang | ................... | H01L 23/4093 165/80.3 |
| 7,677,299 B2 * | 3/2010 | Zheng | ................. | F28D 15/0233 165/104.26 |
| 7,690,418 B2 * | 4/2010 | Chen | ................... | H01L 23/427 165/104.33 |
| 7,746,652 B2 * | 6/2010 | Horng | ................. | H01L 23/4093 165/80.3 |
| 7,750,252 B2 * | 7/2010 | Colby | .................... | H01L 23/34 165/80.3 |
| 7,802,616 B2 * | 9/2010 | Chen | ................... | H01L 23/427 165/104.33 |
| 8,123,382 B2 * | 2/2012 | Patrick | .................. | F21V 29/004 362/218 |
| 8,385,071 B2 * | 2/2013 | Lin | ...................... | H01L 23/467 165/185 |
| 8,505,615 B2 * | 8/2013 | Lin | .................... | F28D 15/0275 165/121 |
| D698,481 S * | 1/2014 | Wasserman | .................. | D26/120 |
| 8,665,595 B2 * | 3/2014 | Wyatt | ...................... | G06F 1/203 361/690 |
| D786,202 S * | 5/2017 | Hodrinsky | .................... | D13/179 |
| 10,299,365 B1 * | 5/2019 | Narasimhan | ......... | H05K 1/0203 |
| 2002/0003691 A1 * | 1/2002 | Eesley | ...................... | F28F 3/02 361/703 |
| 2003/0230398 A1 * | 12/2003 | Lee | .................... | F28D 15/0266 165/104.21 |
| 2004/0256085 A1 * | 12/2004 | Barsun | ...................... | F28F 3/02 165/80.3 |
| 2004/0261976 A1 * | 12/2004 | Watanabe | .............. | H01L 23/467 165/87 |
| 2005/0103471 A1 * | 5/2005 | Chen | ................... | H01L 23/467 165/80.3 |
| 2005/0168946 A1 * | 8/2005 | Watanabe | ............. | H01L 23/467 361/697 |
| 2005/0224217 A1 * | 10/2005 | Whitney | ............. | F28D 15/0233 165/104.33 |
| 2006/0011325 A1 * | 1/2006 | Schlitz | ................... | H01L 23/367 165/80.3 |
| 2006/0070723 A1 * | 4/2006 | Lopatinsky | ............. | F28D 13/00 165/104.16 |
| 2007/0146995 A1 * | 6/2007 | Zhao | ................... | H01L 23/4006 361/697 |
| 2007/0242433 A1 * | 10/2007 | Lin | ...................... | H01L 23/4006 361/697 |
| 2008/0117596 A1 | 5/2008 | Watanabe et al. | | |
| 2008/0121368 A1 * | 5/2008 | Chen | ................... | H01L 23/427 165/80.3 |
| 2008/0128110 A1 * | 6/2008 | Lai | ........................ | G06F 1/20 165/80.3 |
| 2008/0158816 A1 * | 7/2008 | Hung | ................... | H01L 23/467 361/697 |
| 2008/0174964 A1 * | 7/2008 | Zhou | ................... | H01L 23/427 361/702 |
| 2009/0129019 A1 * | 5/2009 | Li | ........................ | H01L 23/4006 361/697 |
| 2009/0165997 A1 * | 7/2009 | Ma | ........................ | H01L 23/367 165/80.3 |
| 2009/0260779 A1 * | 10/2009 | Zhou | ................... | H01L 23/427 165/80.3 |
| 2009/0288806 A1 * | 11/2009 | Lin | ...................... | H01L 23/367 165/80.3 |
| 2010/0018670 A1 * | 1/2010 | Azar | ................... | H01L 23/4093 165/80.3 |
| 2010/0038056 A1 * | 2/2010 | Ellsworth | ............. | F28D 1/0472 165/80.3 |
| 2010/0073876 A1 * | 3/2010 | Liu | .................... | H01L 23/3672 361/696 |
| 2010/0091495 A1 * | 4/2010 | Patrick | .................. | F21V 29/004 362/249.02 |
| 2010/0132918 A1 * | 6/2010 | Lin | ...................... | H01L 23/467 165/80.3 |
| 2010/0147491 A1 * | 6/2010 | Chen | ................... | H01L 23/4006 165/80.3 |
| 2010/0235991 A1 * | 9/2010 | Ward | .................... | A47C 21/044 5/423 |
| 2010/0238630 A1 * | 9/2010 | Xu | .................... | F28D 15/0233 361/700 |
| 2010/0258272 A1 * | 10/2010 | Li | ........................ | H01L 23/467 165/80.3 |
| 2011/0036552 A1 * | 2/2011 | Lu | ........................ | B01D 53/8675 165/185 |

(56) References Cited

U.S. PATENT DOCUMENTS

| | | | |
|---|---|---|---|
| 2011/0094711 A1* | 4/2011 | Chen | F28D 15/0233 165/104.26 |
| 2011/0146948 A1* | 6/2011 | Yang | H01L 23/4006 165/67 |
| 2012/0227948 A1* | 9/2012 | Chen | H01L 23/3672 165/185 |
| 2013/0083485 A1* | 4/2013 | Tong | H01L 23/427 361/700 |
| 2013/0175021 A1* | 7/2013 | Takigawa | H05K 7/209 165/185 |
| 2013/0269920 A1* | 10/2013 | Taketomi | F28F 3/02 165/185 |
| 2014/0014308 A1* | 1/2014 | Wu | F28F 3/02 165/185 |
| 2014/0184050 A1* | 7/2014 | Mizuta | F21V 29/717 313/35 |
| 2014/0307388 A1* | 10/2014 | Chiu | H01L 23/473 361/702 |
| 2015/0096720 A1* | 4/2015 | Lin | H01L 23/3672 165/104.21 |
| 2015/0189791 A1* | 7/2015 | Tamura | B23P 15/26 165/148 |
| 2017/0097196 A1* | 4/2017 | Yoo | F28F 3/04 |
| 2018/0080717 A1* | 3/2018 | Kawabata | H01L 23/36 |
| 2018/0192545 A1* | 7/2018 | Chen | F28F 3/12 |

\* cited by examiner

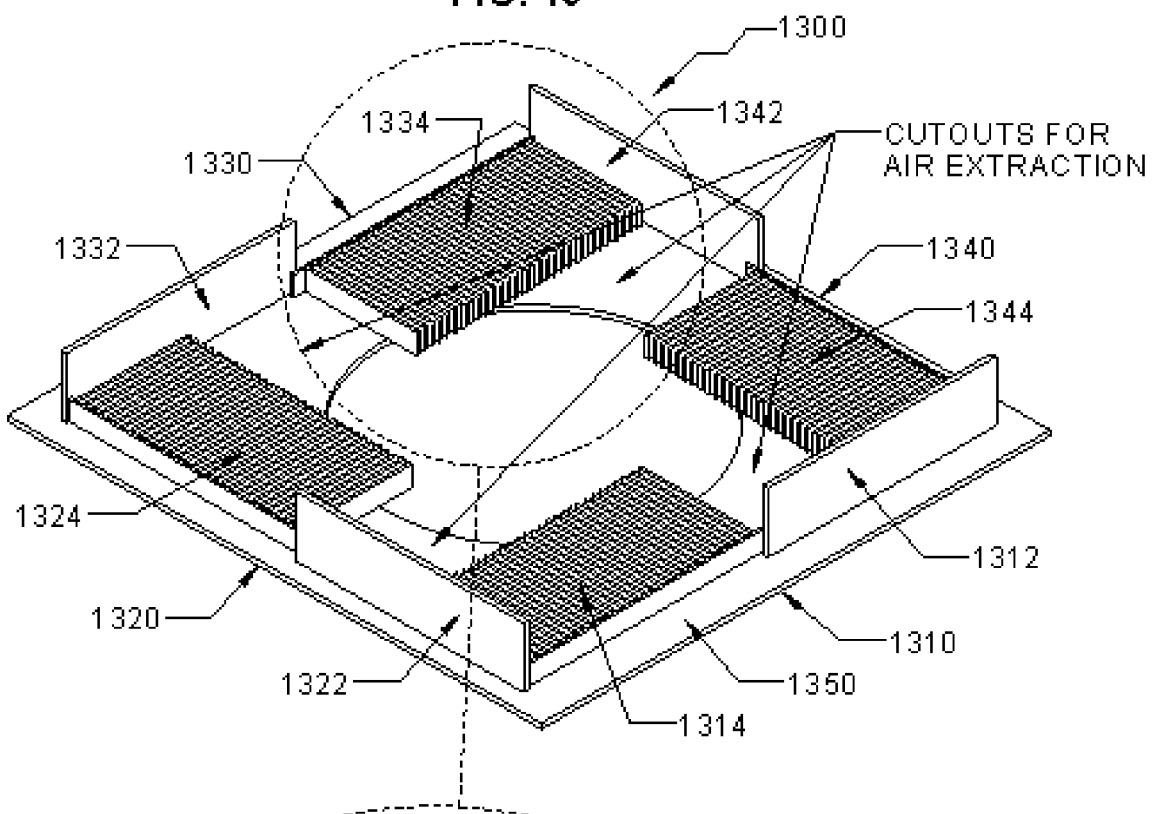
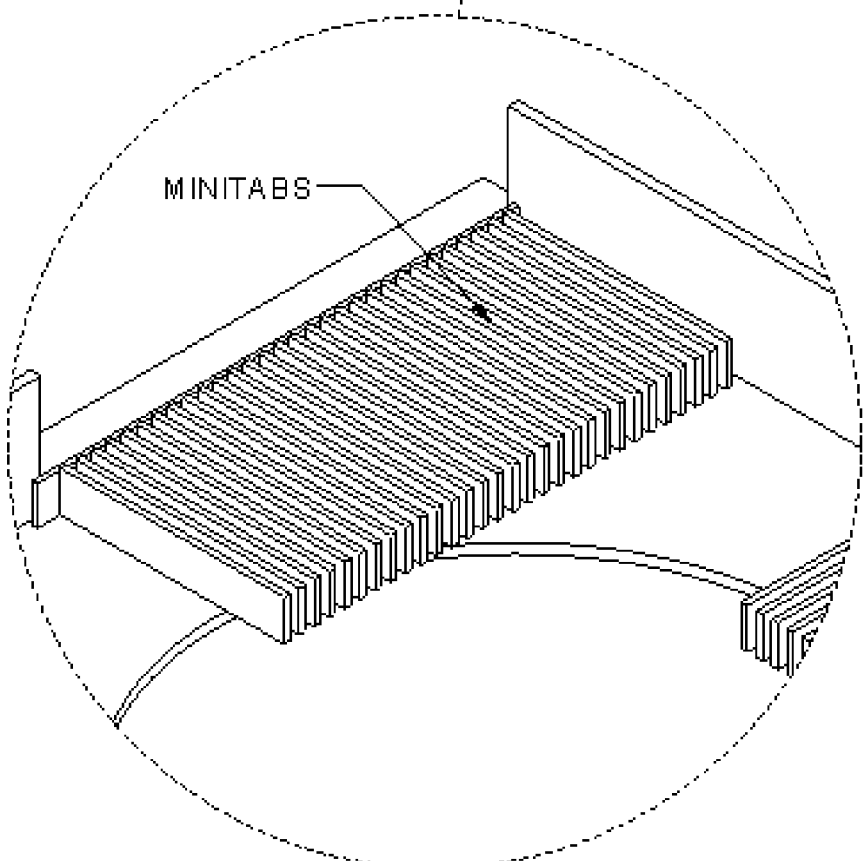
FIG. 13

FIG. 15
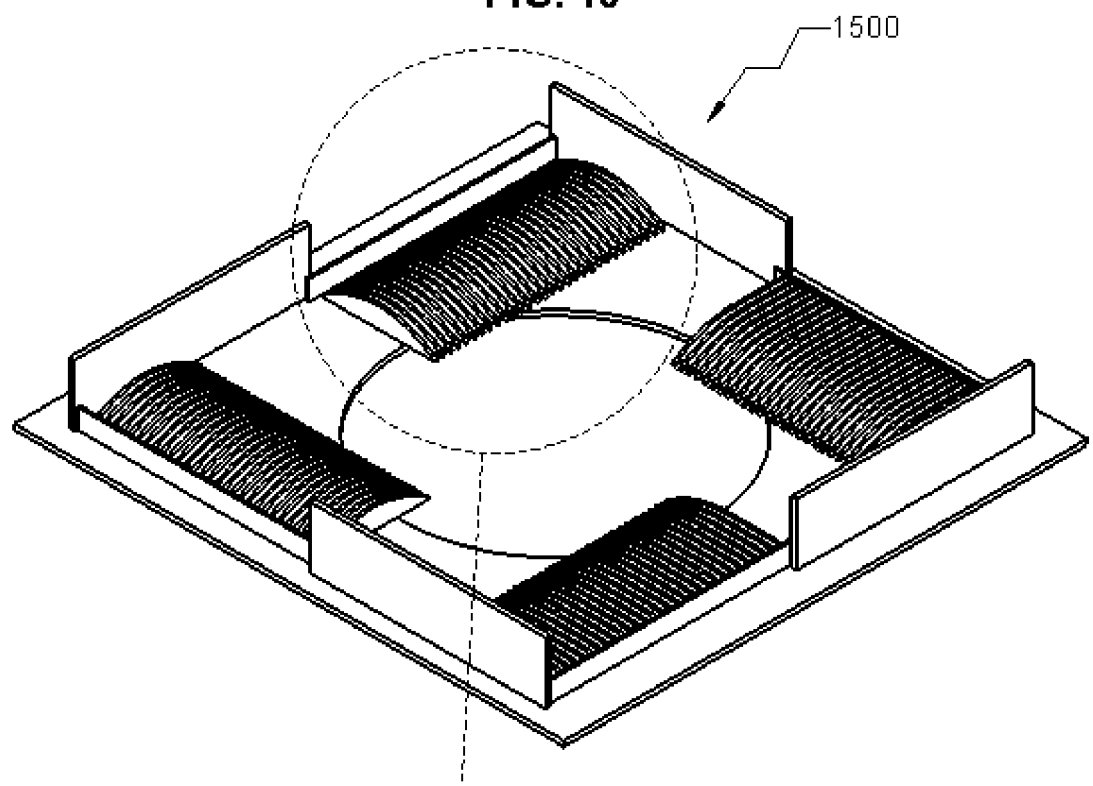
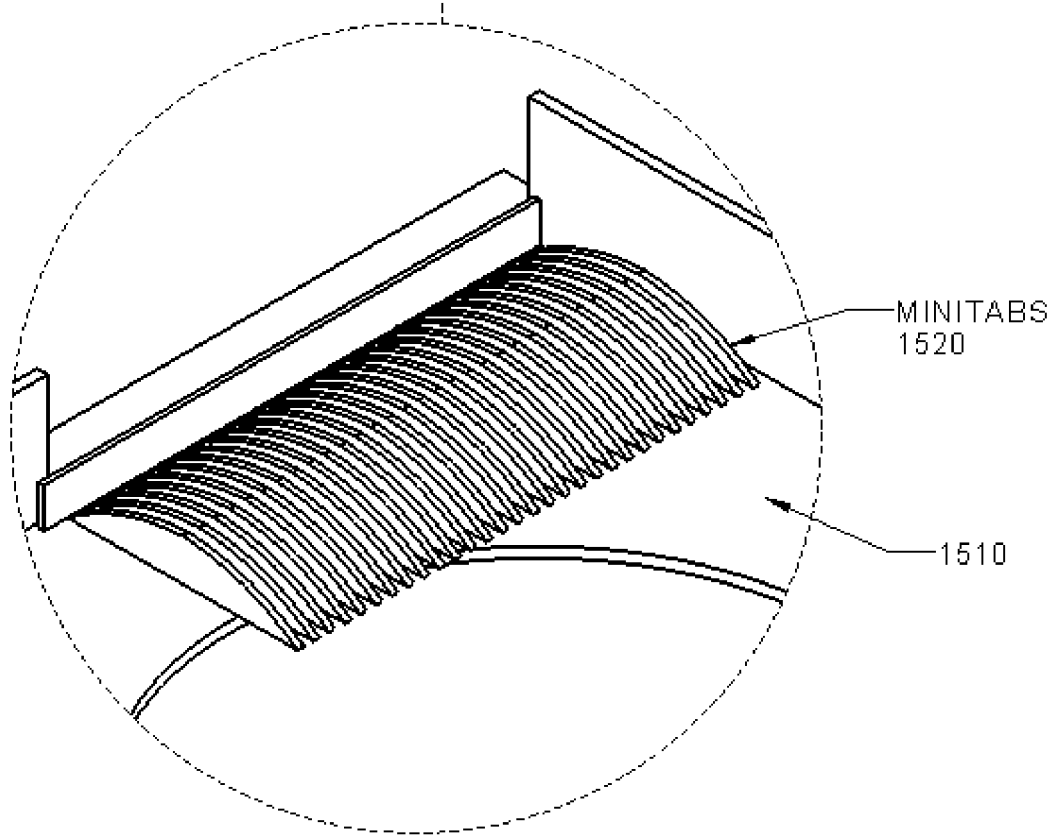

MULTIPLE FLOW ENTRANCE HEAT SINK

CROSS REFERENCE TO RELATED APPLICATION(S)

This application is a non-provisional patent application claiming the benefit of the filing date of the U.S. Provisional Patent Application Ser. No. 61/978,129 filed Apr. 10, 2014 and titled "Multiple Flow Entrance Heat Sink" which is hereby incorporated by reference.

BACKGROUND

The present invention relates to an apparatus and method of cooling a heat producing electronic component. More specifically, the invention relates to a novel configuration and design to provide a high thermal performance for cooling of high power electronic devices.

It is important to dissipate heat produced by electronic devices in order to extend the useful life of these devices. Heat dissipation is particularly important in the case of high-power electronic components, such as microprocessors and lasers, which generate a relatively high amount of heat in a relatively small area. Conventional heat sink devices typically utilize an array of extended surfaces, such as fins, integrally formed on a common base. The array of extended surfaces project into an ambient fluid surrounding the device. The base is placed in intimate contact with the heat-producing device to provide a conduction path to the fin array. Through forced or natural convention, fluid circulation around the fin array acts as the heat transfer medium for cooling the device to an operable temperature.

Designing acceptable heat exchangers to adequately dissipate the heat generated by these heat generating components is challenging. These electronic components are typically used within a system housed in an enclosed cabinet having a fan mounted therein. The fan acts to pull cooling fluid across the heat generating electrical components. Given their relative simplicity, traditional extruded plate fin heat exchangers are generally preferred both because of cost and implementation. Traditional plate fin heat exchangers generally offer high surface area relative to their volume. However, the design of the conventional plate fin heat exchanger is often inadequate for dissipating heat generated from high power electronic components.

SUMMARY OF THE INVENTION

The invention comprises an apparatus and method for high thermal performance of a heat sink where a novel fin layout and fluid flow management are provided. The structure that can be assembled from individual formed plates has a base in communication with a fin field. The fin field includes at least one sectional wall to separate the fin field into a plurality of fin sections comprising a plurality of spaced fins creating a base or in communication with the base. The sectional wall prevents the fluid flow from the plurality of fin sections from mixing. A first fin section comprises a first fluid inlet with a first fluid flow in a first direction and a second fin section comprises a second fluid inlet with a second fluid flow in a second direction. The first and second directions are different directions. Fluid exits the fin field and respective exit(s) proximate to the at least one sectional wall.

Other features and advantages of this invention will become apparent from the following detailed description of the presently preferred embodiment(s) of the invention, taken in conjunction with the accompanying drawings.

BRIEF DESCRIPTION OF THE DRAWINGS

The drawings referenced herein form a part of the specification. Features shown in the drawings are meant as illustrative of only some embodiments of the invention, and not of all embodiments of the invention unless otherwise explicitly indicated.

FIG. 13 depicts a top view of a plenum featuring one or more sets of mini-tabs.

FIG. 15 depicts a top view of a plenum plate with one or more sets of tines.

DETAIL DESCRIPTION

It will be readily understood that the components of the present invention, as generally described and illustrated in the Figures herein, may be arranged and designed in a wide variety of different configurations. Thus, the following detailed description of the embodiments of the apparatus, system, and method of the present invention, as presented in the Figures, is not intended to limit the scope of the invention, as claimed, but is merely representative of selected embodiments of the invention.

Reference throughout this specification to "a select embodiment," "one embodiment," or "an embodiment" means that a particular feature, structure, or characteristic described in connection with the embodiment is included in at least one embodiment of the present invention. Thus, appearances of the phrases "a select embodiment," "in one embodiment," or "in an embodiment" in various places throughout this specification are not necessarily referring to the same embodiment.

The illustrated embodiments of the invention will be best understood by reference to the drawings, wherein like parts are designated by like numerals throughout. The following description is intended only by way of example, and simply illustrates certain selected embodiments of devices, systems, and processes that are consistent with the invention as claimed herein.

Figure 1:
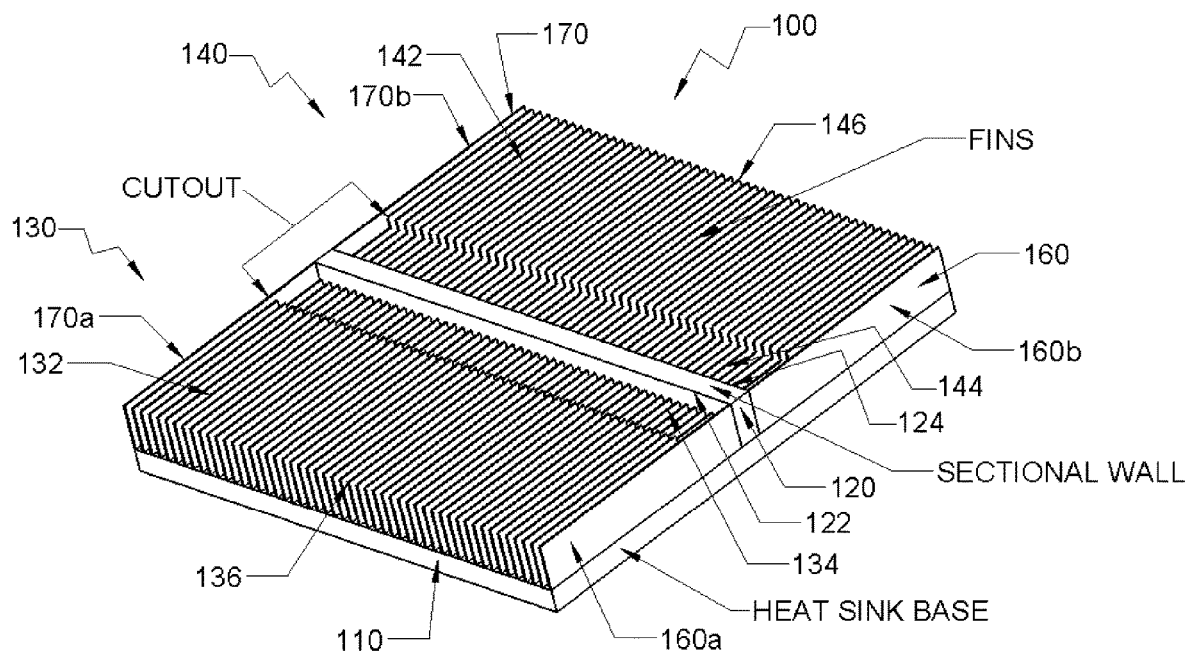
FIG. 1 depicts a perspective view of a heat sink with a sectional wall.

The salient features of the novel heat sink include a sectional wall, multiple and in one embodiment, opposing, fluid entrances, and a superior fluid flow management system. FIG. 1 is a perspective view (100) of a heat sink with a sectional wall. In one embodiment, the sectional wall bisects the fin field. As shown, a base (110) extends the surface area of the heat sink, and a sectional wall (120) crosses the center of the heat sink. The sectional wall (120) divides fluid flow into multiple sections and functions to prevent mixing of fluid flow from the different fin section as it is traditionally seen in fansink where the fin field is either parallel plate or cross cut (pin fins). For descriptive purposes, the heat sink and associated fins will be described with respect to each of the sections. Although the heat sink shown and described in FIG. 1 has a single sectional wall, it is understood that in one embodiment, two or more sectional walls may be provided. Fins are attached to the base (110). A variety of methods may be employed for attaching the fins to the base, including but not limited to, soldering and brazing. Specifically, a first set of fins (132) are attached to the base (110) in a first section (130) of the heat sink forming a first fin field (136), and a second set of fins (142) are attached to the base (110) in a second section (140) of the heat sink forming a second fin field (146). In one embodiment, the first and second fin fields (136) and (146), respectively, are combined to form a single fin field with fin sections (136) and (146). The fin sections (136) and (146) are shown herein separated by a sectional wall (120), which in one embodiment, is formed as an integral part of the single fin field.

The sectional wall (120) has two sides, first side (122) is adjacent to the first set of fins (132) and a second side (124) is adjacent to the second set of fins (142). Each of the first and second sets of fins (132) and (142), respectively, has a subsection with a shorter fin field. As shown, the first subsection (134) has a first shorter fin field with respect to the height of the first set of fins (132), and the second subsection (144) has a second shorter fin field with respect to the height of the second set of fins (142). In one embodiment, the height of the fin fields of the first and second subsections (134) and (144), respectively, are at or near the same height. Furthermore, each of the fin fields of the first and second subsections (134) and (144) are in communication with the sectional wall (120) at (122) and (124), respectively, and the associated fin field at (136) and (146), respectively. Furthermore, an external fin is shown along the perimeter of the heat sink. A first external fin (160) is shown having two sections (160a) and (160b), and a second external fin (170) is shown having two sections (170a) and (170b), with each external fin extending to the sectional wall at (122) and (124). Each of the external fins, and specifically external fin sections, have a height extending from the heat sink base (110) to at or near the height of the first set of fins (132) and the second subsection fins (134).

As shown and described in FIG. 1, each of the fin fields, including the subsections with the shorter fin heights and the external fins, are in communication with the sectional wall (120). The sectional wall (120) crosses the heat sink at or near the center thereof. The sectional wall (120) functions to divide the fluid flow into multiple sections, and in the embodiment shown herein into at least two sections. Accordingly, a multi-entry feature is enabled by two or more fin sections which are constructed inside the divisions created by the sectional wall (120).

Figure 2:
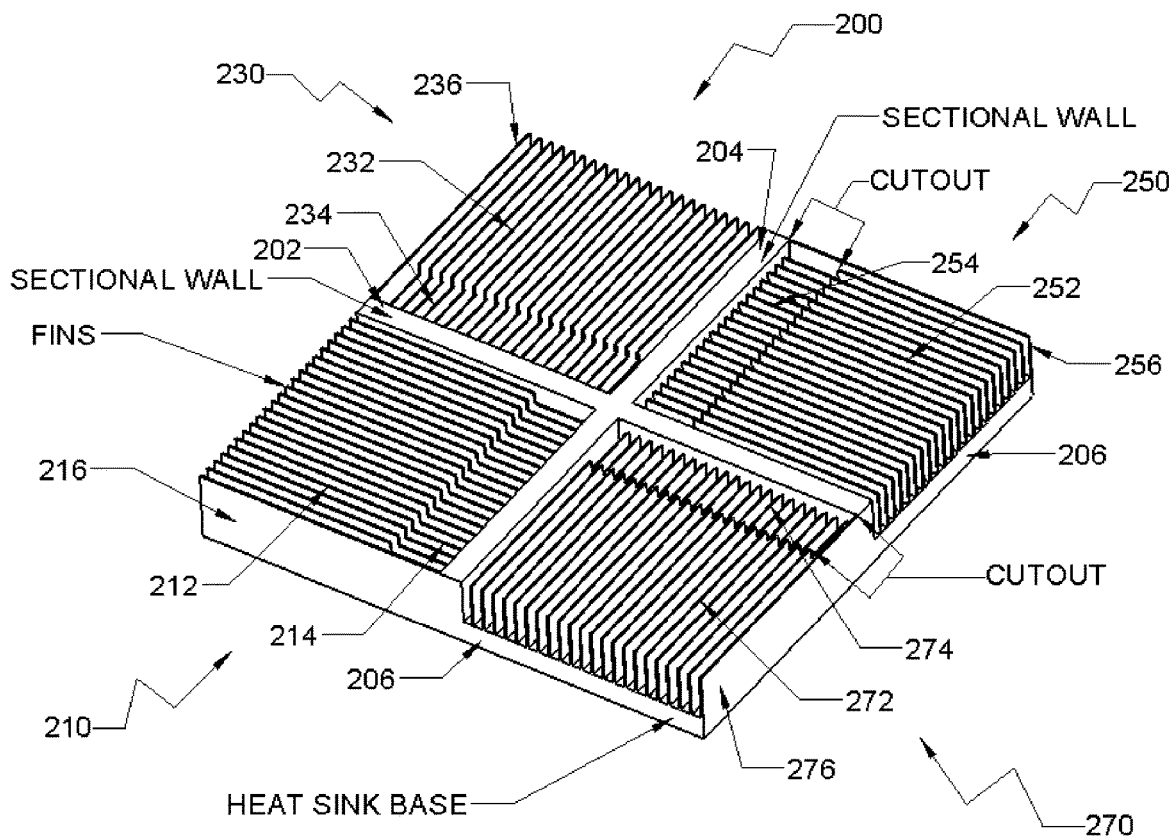
FIG. 2 depicts a perspective view of the heat sink of FIG. 1 showing the arrangement of the fins separated into quadrants.

FIG. 2 is a perspective view (200) of the heat sink of FIG. 1 showing the arrangement of the fins separated into quadrants. As shown, there are four quadrants (210), (230), (250), and (270). The quadrants are created by two sectional walls (202) and (204). Each of the quadrants has a fin field similar to that shown and described in FIG. 1. Specifically, quadrant (210) has a fin field separated into two subsections (212) and (214). Both subsections (212) and (214) are in communication with the base (206). The first subsection (212) extends from a perimeter of the base (206) to the second subsection (214), and the second subsection (214) is in communication with the sectional walls (204) and (202). In one embodiment, the fin field of the first quadrant (210) is parallel to sectional wall (202) and perpendicular to sectional wall (204). The height of the fins of the first subsection (212) is relatively uniform, and the height of the fins of the second subsection (214) is relatively uniform, with the height of the fins of the first subsection (212) being taller than the height of the fins of the second subsection (214). Furthermore, an external fin (216) is mounted parallel to the fin field of the first quadrant (210) and extends from the perimeter to the sectional wall (204), and as shown herein the external fin (216) has a height at or near the height of the fin field of the first subsection (212).

The second quadrant (230) has a fin field separated into two subsections (232) and (234). Both subsections (232) and (234) are in communication with the base (206). The first subsection (232) extends from a perimeter of the base (206) to the second subsection (234), and the second subsection (234) is in communication with the sectional walls (204) and (202). In one embodiment, the fin field of the second quadrant (230) is perpendicular to sectional wall (202) and parallel to sectional wall (204). The height of the fins of the first subsection (232) is relatively uniform, and the height of the fins of the second subsection (234) is relatively uniform, with the height of the fins of the first subsection (232) being taller than the height of the fins of the second subsection (234). Furthermore, an external fin (236) is mounted parallel to the fin field of the second quadrant (230) and extends along the perimeter to the sectional wall (202), and as shown herein the external fin (236) has a height at or near the height of the fin field of the first subsection (232).

The third quadrant (250) has a fin field separated into two subsections (252) and (254). Both subsections (252) and (254) are in communication with the base (206). The first subsection (252) extends from a perimeter of the base (206) to the second subsection (254), and the second subsection (254) is in communication with the sectional walls (204) and (202). In one embodiment, the fin field of the third quadrant (250) is perpendicular to sectional wall (204) and parallel to sectional wall (202). The height of the fins of the first subsection (252) is relatively uniform, and the height of the fins of the second subsection (254) is relatively uniform, with the height of the fins of the first subsection (252) being taller than the height of the fins of the second subsection (254). Furthermore, an external fin (256) is mounted parallel to the fin field of the third quadrant (250) and extends along the perimeter to the sectional wall (204), and as shown herein the external fin (256) has a height at or near the height of the fin field of the first subsection (252).

The fourth quadrant (270) has a fin field separated into two subsections (272) and (274). Both subsections (272) and (274) are in communication with the base (206). The first subsection (272) extends from a perimeter of the base (206) to the second subsection (274), and the second subsection (274) is in communication with the sectional walls (204) and (202). In one embodiment, the fin field of the fourth quadrant (270) is perpendicular to sectional wall (202) and parallel to sectional wall (204). The height of the fins of the first subsection (272) is relatively uniform, and the height of the fins of the second subsection (274) is relatively uniform, with the height of the fins of the first subsection (272) being taller than the height of the fins of the second subsection (274). Furthermore, an external fin (276) is mounted parallel to the fin field of the fourth quadrant (270) and extends along the perimeter to the sectional wall (202), and as shown herein the external fin (276) has a height at or near the height of the fin field of the first subsection (272).

Figure 3:
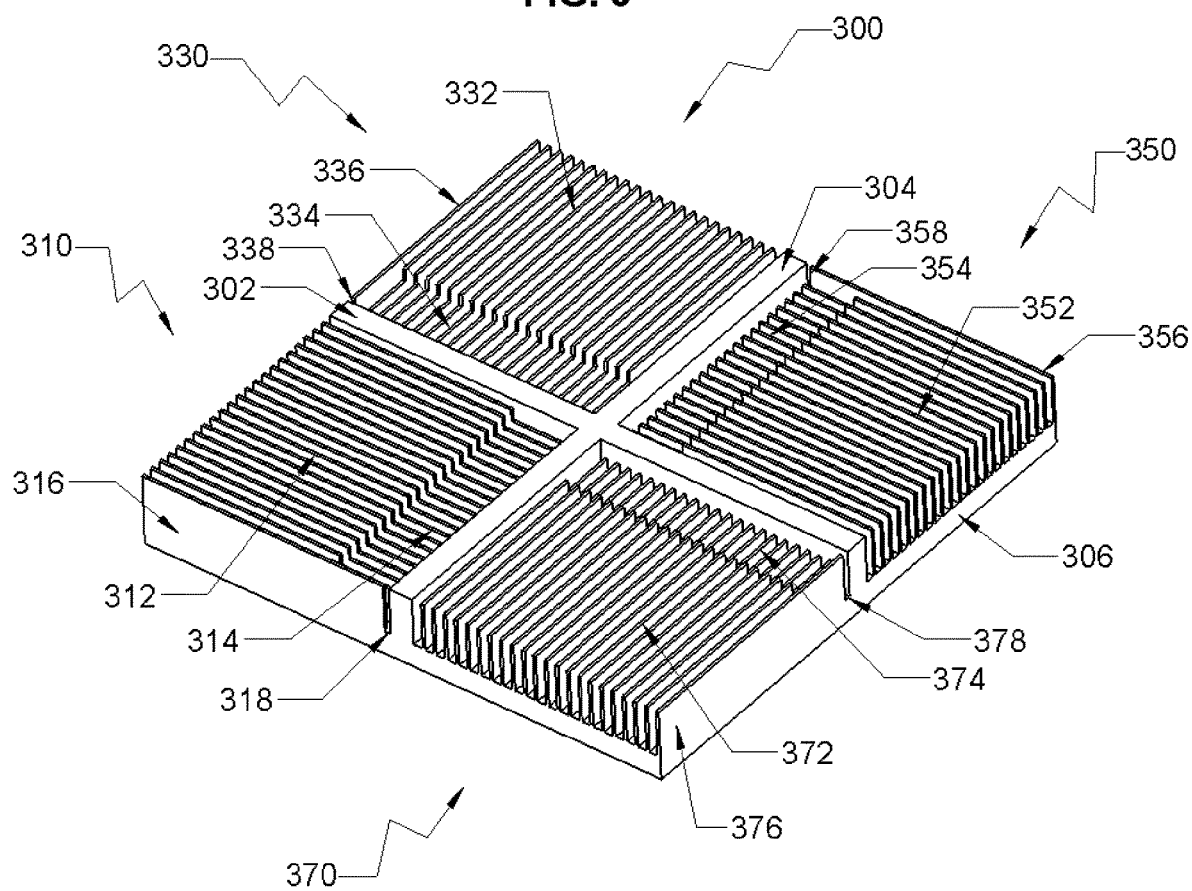
FIG. 3 depicts a perspective view of the heat sink of FIG. 2 showing the arrangement of the fins with respect to the sectional wall with an opening formed between each of the fin fields and the respective sectional walls.

FIG. 3 is a perspective view (300) of the heat sink of FIG. 2 showing the arrangement of the fins with respect to the sectional wall with an opening formed between each of the fin fields and the respective sectional walls. However, in this embodiment, the fins fields of the respective quadrants are not attached to the sectional wall(s). As shown, there are four quadrants (310), (330), (350), and (370). The quadrants are created by two sectional walls (302) and (304). Each of the quadrants has a fin field similar to that shown and described in FIG. 2. Specifically, the first quadrant (310) has a fin field separated into two subsections (312) and (314). Both subsections (312) and (314) are in communication with the base (306). The first subsection (312) extends from a perimeter of the base (306) to the second subsection (314), and the second subsection (314) is in communication with the sectional wall (302). A gap (318) is placed between the fin field of the second subsection (314) and sectional wall (304). The gap (318) extends the length of the fin field of the second subsection (314). In one embodiment, the fin field of the first quadrant (310) is parallel to sectional wall (302) and perpendicular to sectional wall (304). The height of the fins of the first subsection (312) is relatively uniform, and the height of the fins of the second subsection (314) is relatively uniform, with the height of the fins of the first subsection (312) being taller than the height of the fins of the second subsection (314). Furthermore, an external fin (316) is mounted parallel to the fin field of the first quadrant (310) and extends from the perimeter to the gap (318), and as shown herein the external fin (316) has a height at or near the height of the fin field of the first subsection (312).

The second quadrant (330) has a fin field separated into two subsections (332) and (334). Both subsections (332) and (334) are in communication with the base (306). The first subsection (332) extends from a perimeter of the base (306) to the second subsection (334), and the second subsection (334) is in communication with the sectional wall (304). A gap (338) is placed between the fin field of the second subsection (334) and sectional wall (302). The gap (338) extends the length of the fin field of the second subsection (334). In one embodiment, the fin field of the second quadrant (330) is perpendicular to sectional wall (302) and parallel to sectional wall (304). The height of the fins of the first subsection (332) is relatively uniform, and the height of the fins of the second subsection (334) is relatively uniform, with the height of the fins of the first subsection (332) being taller than the height of the fins of the second subsection (334). Furthermore, an external fin (336) is mounted parallel to the fin field of the second quadrant (330) and extends from the perimeter to the gap (338), and as shown herein the external fin (336) has a height at or near the height of the fin field of the second subsection (332).

The third quadrant (350) has a fin field separated into two subsections (352) and (354). Both subsections (352) and (354) are in communication with the base (306). The first subsection (352) extends from a perimeter of the base (306) to the second subsection (354), and the second subsection (354) is in communication with the sectional wall (302). A gap (358) is placed between the fin field of the second subsection (354) and sectional wall (304). The gap (358) extends the length of the fin field of the second subsection (354). In one embodiment, the fin field of the third quadrant (350) is parallel to sectional wall (302) and perpendicular to sectional wall (304). The height of the fins of the first subsection (352) is relatively uniform, and the height of the fins of the second subsection (354) is relatively uniform, with the height of the fins of the first subsection (352) being taller than the height of the fins of the second subsection (354). Furthermore, an external fin (356) is mounted parallel to the fin field of the third quadrant (350) and extends from the perimeter to the gap (358), and as shown herein the external fin (356) has a height at or near the height of the fin field of the second subsection (352).

The fourth quadrant (370) has a fin field separated into two subsections (372) and (374). Both subsections (372) and (374) are in communication with the base (306). The first subsection (372) extends from a perimeter of the base (306) to the second subsection (374), and the second subsection (374) is in communication with the sectional wall (304). A gap (378) is placed between the fin field of the second subsection (374) and sectional wall (302). The gap (378) extends the length of the fin field of the second subsection (374). In one embodiment, the fin field of the fourth quadrant (370) is perpendicular to sectional wall (302) and parallel to sectional wall (304). The height of the fins of the first subsection (372) is relatively uniform, and the height of the fins of the second subsection (374) is relatively uniform, with the height of the fins of the first subsection (372) being taller than the height of the fins of the second subsection (374). Furthermore, an external fin (376) is mounted parallel to the fin field of the fourth quadrant (370) and extends from the perimeter to the gap (378), and as shown herein the external fin (376) has a height at or near the height of the fin field of the second subsection (372).

As shown in FIG. 3, each of the fin fields of the separate quadrants (310), (330), (350), and (370) is shown with a gap (318), (338), (358), and (378) between the respective fin fields and an associated sectional wall. Accordingly, in each quadrant, the fin fields are not attached to the respective sectional wall.

The sectional walls provides multiple entrances to the heat sink. More specifically, the multiple entry features is enabled by two or more fin sections which are constructed inside the divisions created by the sectional walls. Each of the sections contains a quantity of fins arranged in a specific pattern such that the aggregate structures a conventional heat sink. As shown in FIGS. 2 and 3, each of the fin sections or quadrants contain precisely positioned cutouts or shorter height fin fields, respectively, in the central portion of the heat sink. Each of the cutouts or shorter height fin fields ensures required flow distribution for enhanced thermal performance. As shown herein, the cutouts or shorter height fin fields are located in each of the fin sections in close proximity to the respective sectional wall. The arrangement of the cutouts or shorter height fin fields minimizes pressure drop across the heat sink.

With respect to FIGS. 2 and 3, the heat sink is provided with multiple entrances. As shown, the heat sink has four sections, e.g. quadrants, resulting in a quad-shaped heat sink with four entrances for fluid intake. The quadrants are created by two sectional walls. The configuration of each of the quadrants is similar to the two sections of the heat sink (100) shown in FIG. 1. Furthermore, FIG. 3 is a perspective view (300) of the heat sink of FIG. 2 showing the arrangement of the fins with respect to the sectional wall with an opening formed between each of the fin fields and the respective sectional walls. Accordingly, in one embodiment, the fin fields are not attached to either of the first and second sectional walls.

The configuration of the heat sink of FIGS. 2 and 3 divides the heat sink into multiple fin fields. As a result of this construction, the fluid enters the heat sink from several sides, travels through the fin fields and is being extracted through a central portion of the heat sink. This feature provides versatility to the heat sink, making it suitable even for applications where one or more heat sink sides are blocked. The fins can be perpendicular to the base or inclined or curved depending upon the thermal requirements. In one embodiment, the fin fields can be in contact with the adjacently positioned sectional walls, or as shown herein the fin fields may not be in contact with the adjacently positioned sectional walls of the heat sink.

Figure 4:
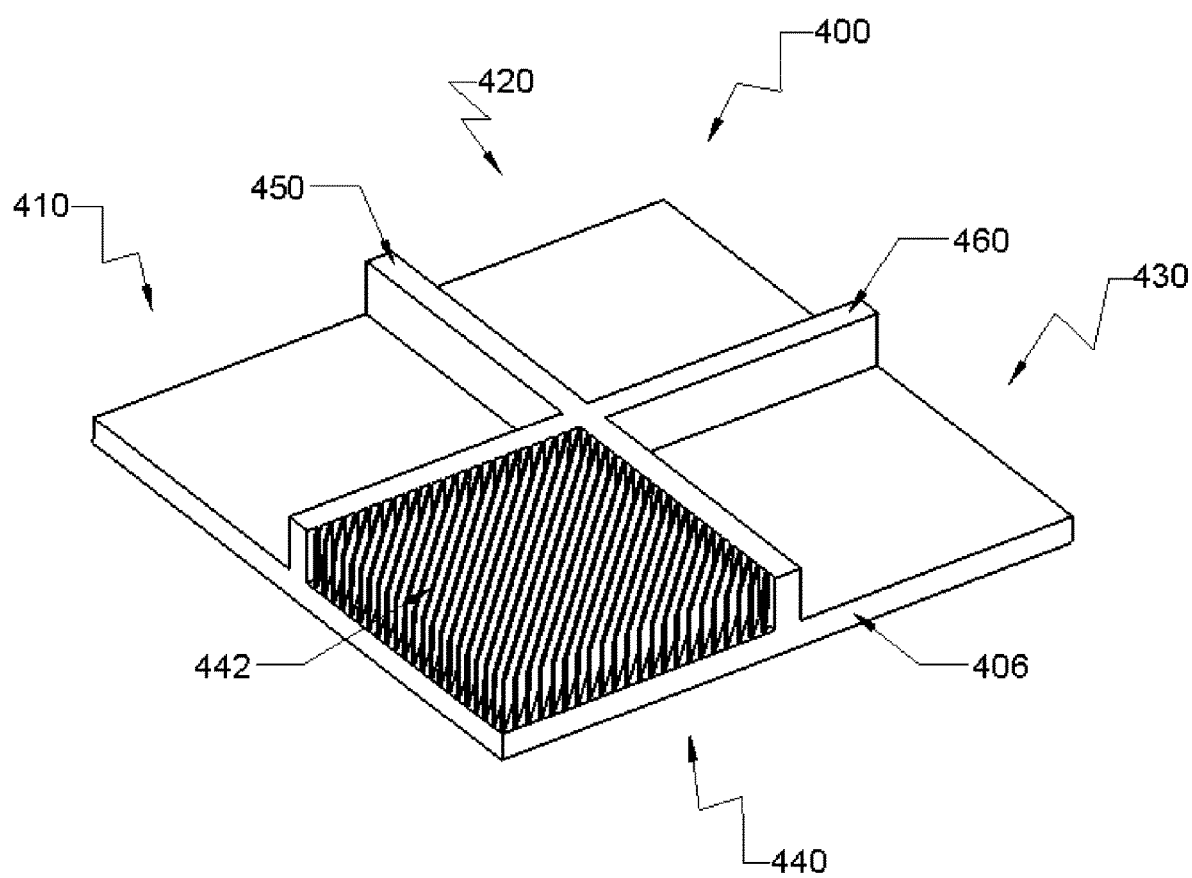
FIG. 4 depicts a perspective view of a multi sectional heat sink with an oblique arrangement of the fin fields.

FIG. 4 is a perspective view (400) of a multi sectional heat sink with an oblique arrangement of the fin fields. As shown, the heat sink (400) has four sections (410), (420), (430), and (440) resulting in a quad-shaped heat sink. The four sections are created by two sectional walls (450) and (460). One of the sections (440) is shown with a fin field (442) in communication with a base (406). More specifically, the fin field has an alignment that is oblique with respect to the sectional walls (450) and (460). Furthermore, in this embodiment, the fin field (442) is shown in communication with sectional walls (450) and (460). In one embodiment, an opening (not shown) may be formed between the fin field (442) and each of the respective sectional walls (450) and (460). Only one fin field (442) is shown in one of the sections (440) of the heat sink (400). In one embodiment, each section (410), (420), and (430) is provided with a fin field.

Figure 5:
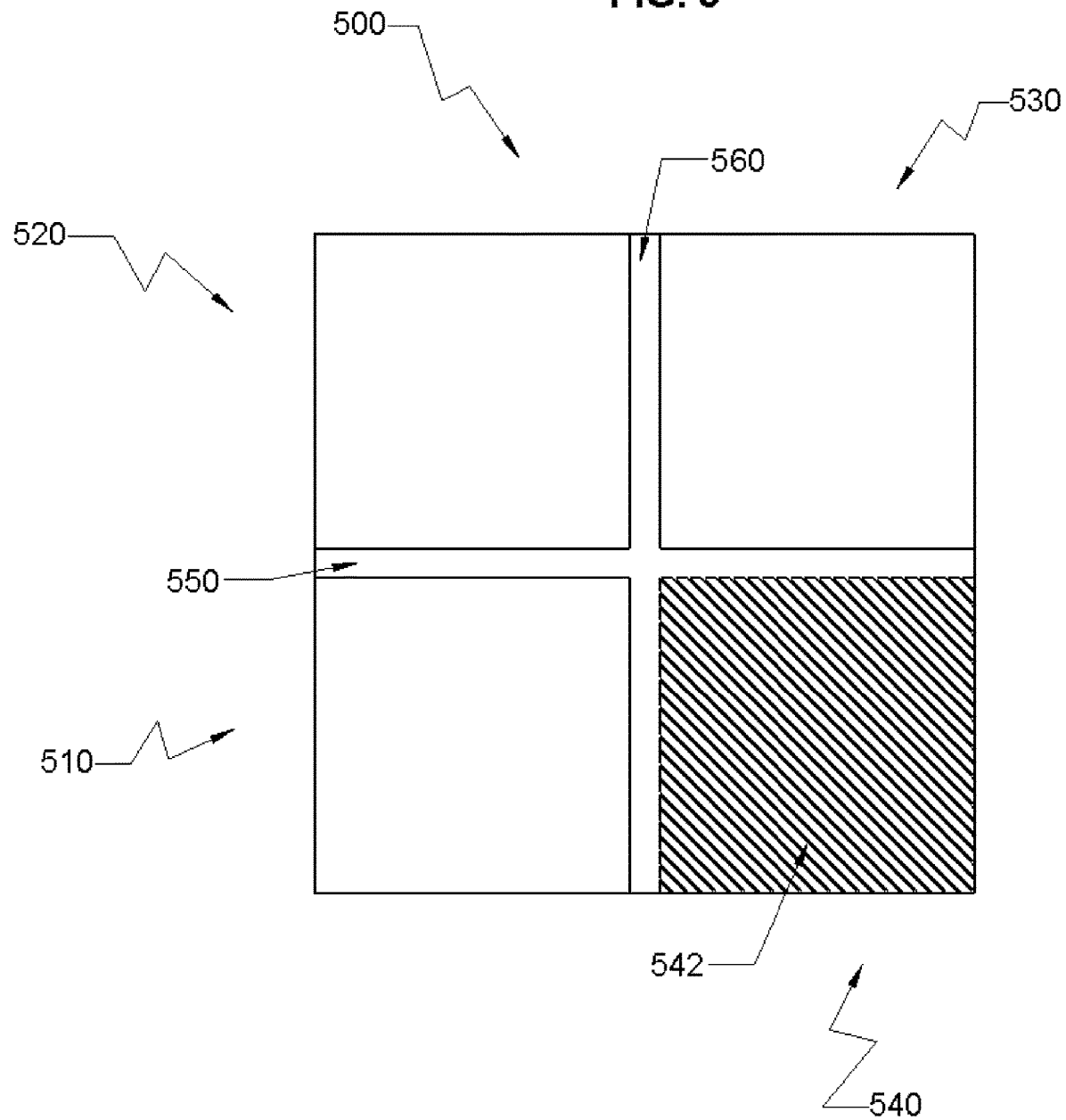
FIG. 5 depicts a top view of the heat sink (500) of FIG. 4.

FIG. 5 is a top view of the heat sink (500) of FIG. 4, showing the arrangement of the fins with respect to the sectional walls. As shown, the fin field (542) is formed in section (540) and obliquely extends from an exterior edge to each of the respective sectional walls (550) and (560). In one embodiment, an opening (not shown) may be formed between the fin field (542) and the sectional walls (550) and (560). Furthermore, in one embodiment, a separate fin field is provided in each of the sections (510), (520), and (530), and (540).

The configuration of the heat sink of FIGS. 4 and 5 divides the heat sink into multiple fin fields having an oblique arrangement of the fins with respect to the sectional walls. In one embodiment, one or more of the fin fields may be configured with positions cutouts (not shown) in the central portion of the heat sink, similar to the fin fields shown in FIGS. 2 and 3 having two different height configurations, and in one embodiment, an opening between the fin field and the associated sectional wall. The cutouts ensure required flow distribution for enhanced thermal performance. In one embodiment, the cutouts are located in one or more of the fin fields in close proximity to the respective sectional wall. The arrangement of the cutouts minimizes the pressure drop across the heat sink.

Figure 6:
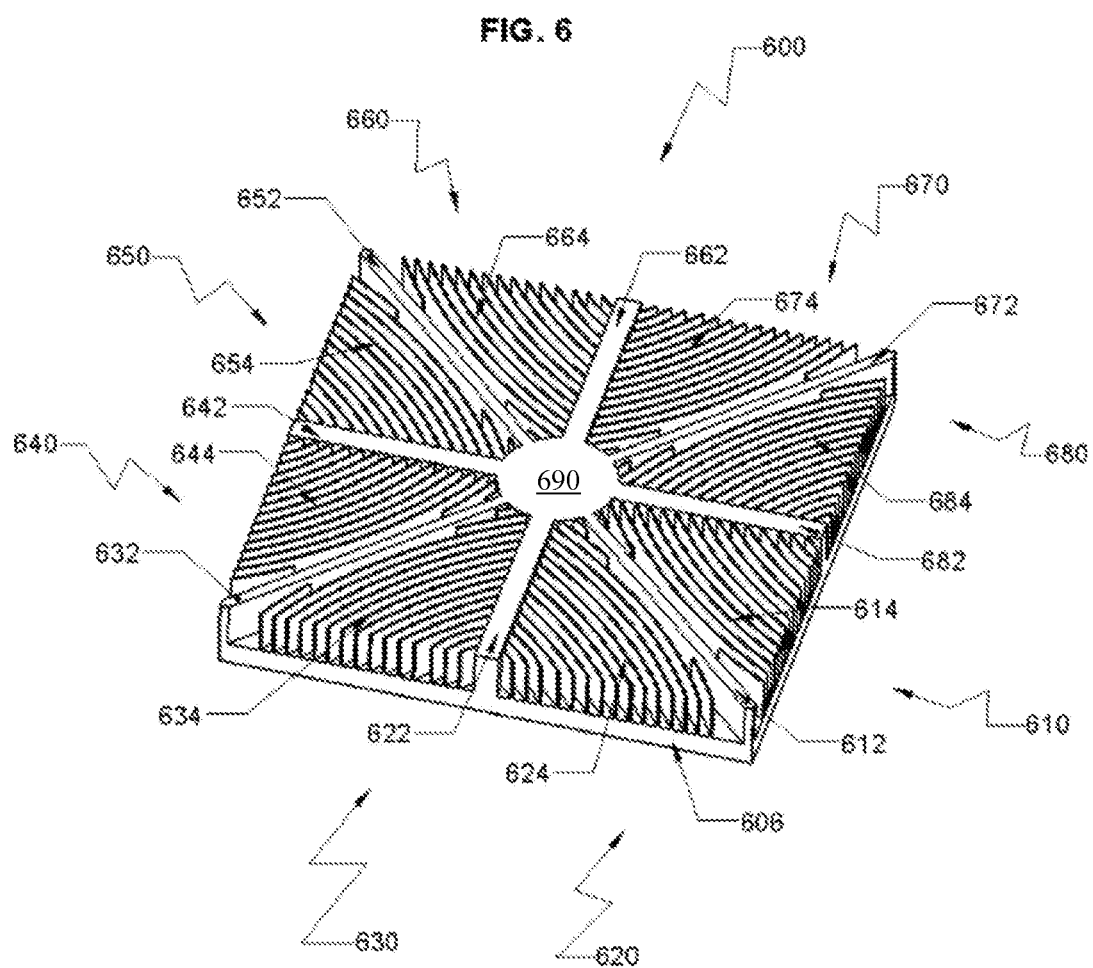
FIG. 6 depicts a perspective view of a heat sink having eight sectional walls, thereby creating eight sections.

FIG. 6 is a perspective view of a heat sink (600) having eight sectional walls, thereby creating eight sections. As shown, there are eight sections (610), (620), (630), (640), (650), (660), (670), and (680). Each section is created with an associated sectional wall. Specifically, section (610) is formed by sectional walls (682) and (612), section (620) is formed by sectional walls (612) and (622), section (630) is formed by sectional walls (622) and (632), section (640) is formed by sectional walls (632) and (642), section (650) is formed by sectional walls (642) and (652), section (660) is formed by sectional walls (652) and (662), section (670) is formed by sectional walls (662) and (672), and section (680) is formed by sectional walls (672) and (682). Each of the sections (610), (620), (630), (640), (650), (660), (670), and (680) has a fin field, namely fin fields (614), (624), (634), (644), (654), (664), (674), and (684), respectively. The fin fields are each in communication with a base (606). Furthermore, the fin fields can individually be connected to the associated sectional walls, or in one embodiment, an opening may be formed between the fin field and the associated sectional wall. A central collector (690) is shown centrally disposed and in communication with each of the sectional walls (612), (622), (632), (642), (652), (662), (672), and (682). In one embodiment, the sectional walls may not be connected to the central connector (690), and are referred to herein as finned sectional walls. The finned sectional walls may be an integral part of the central collector (690), or mechanically, metallurgically, or chemically bonded to the central collector (690). In one embodiment, the central collector (690) is the area of the heat sink (600) wherein the hottest device is attached on non-finned sides of the heat sink. In one embodiment, the central collector (690) is comprised of solid material or composition, i.e. planted with heat pipes or filled with liquid.

As shown in each of the heat sinks of FIGS. 1-6, the fins and associated fin fields are in communication with a base, also referred to herein as a base plate. The base can be made of a solid material, a vapor chamber, or have embedded heat pipes or formed as the result of the zipper finned structure. The sectional walls can be made as an integral part of the associated base or can be metallurgically or chemically bonded to the base. Furthermore, the base and the sectional wall assembly can be comprised of a hollow interior or contain a fluid channel(s) or micro heat pipes to effectively spread the heat across the surfaces of the heat sink. Depending upon application and for the purpose of reducing spreading resistance, enhanced heat conduction tools, such as metallic inserts, vapor chambers, and heat pipes can be deployed in the base or as the base of the sectional heat sink. In one embodiment, the base can have a uniform thickness, or in another embodiment, the thickness of the base may vary. For example, in one embodiment, the thickness of the base may increase from the edge of the heat sink towards the center, e.g. towards the central collector (or sectional wall) or the area where the central collector would be located, or where the sectional walls join. The increase of the thickness of the base as described herein is configured to alleviate the effect of spreading thermal resistance. Other configurations and variations of the base may be available, and the example described herein should not be considered limiting.

Figure 7:
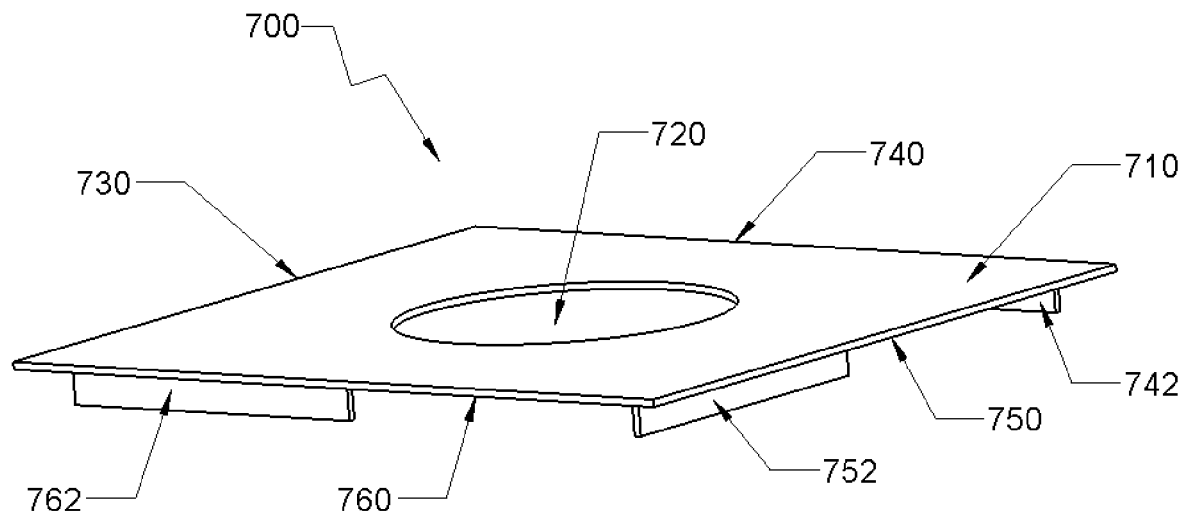
FIG. 7 depicts a top view of a cover plate configured to communication with a heat sink.
Figure 8:
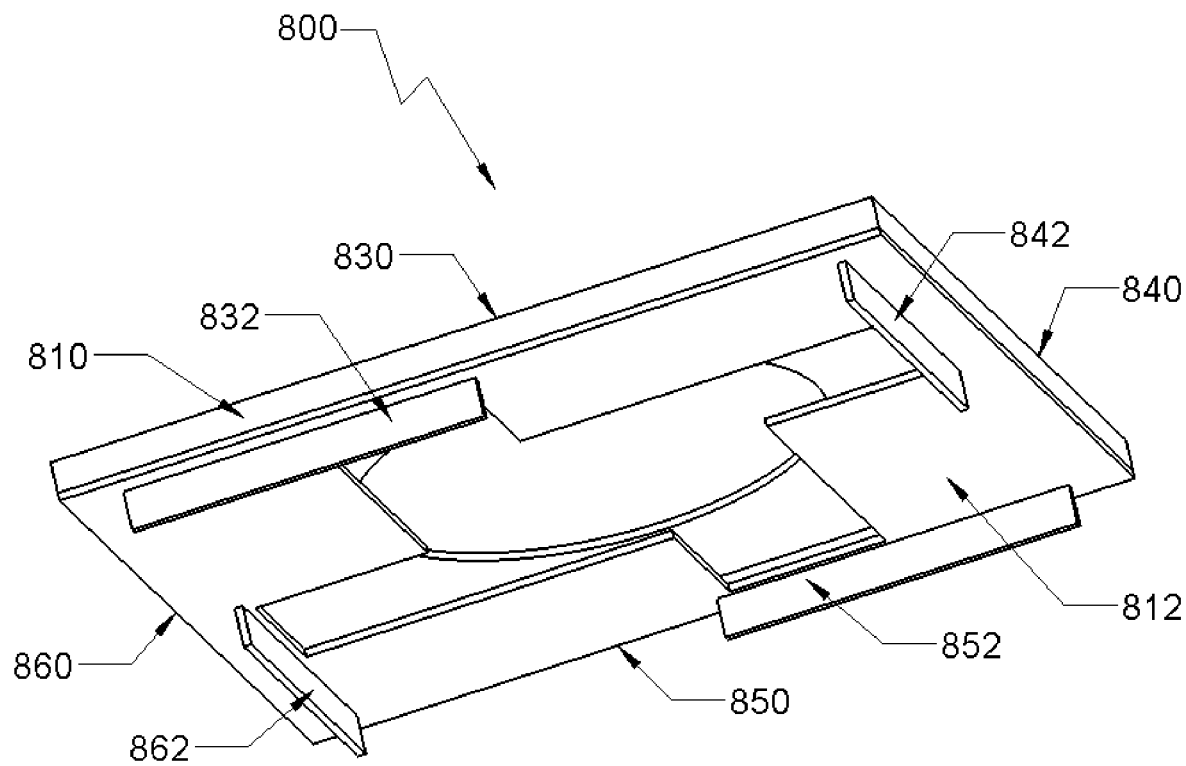
FIG. 8 depicts a bottom view of the cover plate shown in FIG. 7.

Each of the heat sinks described in FIGS. 1-6 have been shown to include one or more sectional walls. In one embodiment, the sectional walls function to isolate fluid flow communication between the sections and create a flow coupling between the heat sinks sections. Each of the heat sinks described herein is configured to accommodate a fluid mover to facilitate fluid flow. The specific fin field configurations with respect to the sectional walls enhance fluid flow management between the fins and an associated fluid mover. As shown in FIGS. 7 and 8, a cover plate or plenum is placed over a top section of the heat sink, and in one embodiment confines the fluid flow to each sectional heat sink thereby minimizing any flow coupling that is detrimental to performance. Furthermore, as shown in FIG. 6, the fins may be arranged in the multiple sections so that they are not orthogonal to each other. This arrangement allows multiple sectional heat sink, e.g. with six, eight, or more sections, where fluid can enter each section from different sides of the heat sink and not mix in the area of the fin field.

As shown herein, the multi-sectional heat sink allows fluid to enter the heat sink from several sides, travels through the fin fields and be extracted through a central portion of the heat sink. This feature provides versatility to the heat sink, making it suitable even for applications where one or more heat sink sides are blocked. The fins can be perpendicular to the base or inclined or curved depending upon the thermal requirements. In one embodiment, the fin fields can be in contact with the adjacently positioned sectional walls, or as shown herein the fin fields may not be in contact with the adjacently positioned sectional walls of the heat sink.

FIG. 7 is a top perspective view of a cover plate (700) configured to communicate with the heat sink, such as the heat sink shown in FIGS. 2 and 3. As shown, the cover plate (700) has a top surface (710) with an opening (720). In one embodiment, the opening (720) is centrally located with respect to the cover plate (700). The cover plate (700) has four sides (730), (740), (750), and (760). Each of the sides is shown with a vertically extending fin. Specifically, side (730) has a vertically extending fin (not shown), side (740) has extending fin (742), side (750) has extending fin (752), and side (760) has extending fin (762). In one embodiment, the extending fin(s) takes the place of the external fins. For example, with respect to FIG. 3, fin (742) may replace fin (356), fin (752) may replace fin (376), and fin (762) may replace fin (316). The extending fins (742), (752), and (762) are sized with respect to the size of the fin field in the associated quadrant. With the cover plate (700), the fins of the fin field (not shown) are ducted to ensure proper heat sink functionality. Specifically, the top surface (710) acts as a ducting wall and provides the ducting functionality. The cover plate (700) is shown herein separate from the fin field, which in one embodiment, is formed as an integral part of the fin field. For example, in one embodiment, the fin field may be formed from a zipper fin construction. As a result, a plurality of fins having different shapes may be assembled on the base (or the base can be formed by the fins as well) to form the fin field, sectional wall, and the cover plate (700).

FIG. 8 is a bottom view of a plenum (800). The plenum (800) is adjustable with respect to the opening (820) of the top surface (810). Furthermore, the plenum (800) is rotated 180 degrees from the plenum cover plate shown in FIG. 7. The plenum (800) may be created between the cover plate shown in FIG. 7 and a top region of the fin field. As shown herein, the plenum comprises two plates, a top plate (810) and a bottom plate (812). The top plate (810) has four sides (830), (840), (850), and (860). Each of the sides is shown with a vertically extending fin. Specifically, side (830) has a vertically extending fin (832), side (840) has a vertically extending fin (842), side (850) has a vertically extending fin (852), and side (860) has a vertically extending fin (862). In one embodiment, the extending fin(s) takes the place of the external fins, and the extending fins are sized with respect to the size of the fin field in the associated quadrant. Furthermore, as shown herein, the extending fins (832), (842), (852), and (862) may be moved and placed within the fin field, thereby changing the size and shape of the opening (820).

Figure 9:
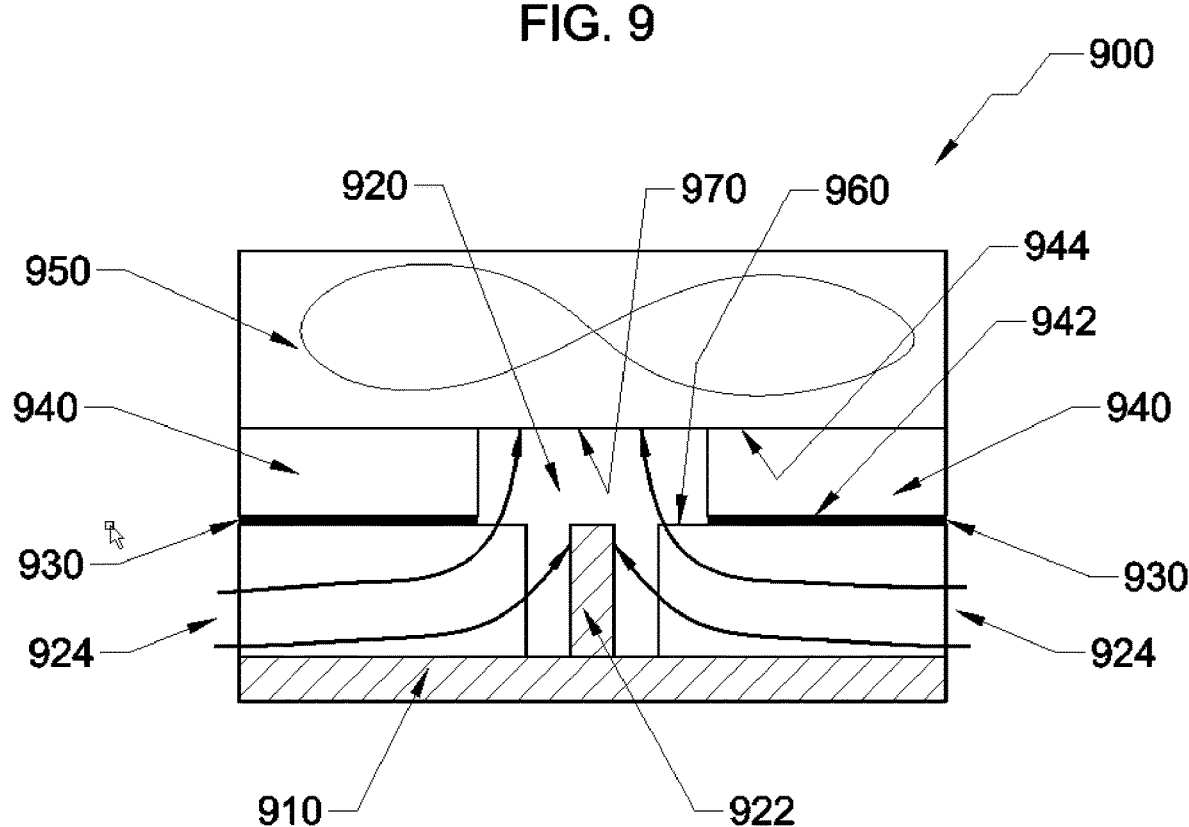
FIG. 9 depicts a sectional view of a heat sink configuration in communication with a plenum.

FIG. 9 is a sectional view of a heat sink configuration (900) of the present invention. As shown herein, the heat sink includes a heat sink base (910), a central portion (920) including a central fin (922) and a fluid path (924), ducting wall (930), plenum (940), and blower (950). The heat sink fins (not shown) are ducted by the ducting wall (930) to ensure flow entering the fin field is not prematurely egressed, hence, maximizing the rate of heat transfer along the fin length. In an exemplary embodiment shown, the plenum comprises a bottom surface (942) and a top surface (944). The bottom surface (942) of the plenum (940) acts as the ducting wall (930) and chamber to create negative pressure to facilitate uniform airflow through the fin field. Fluid leaves the heat sink's fin field and enters the plenum (940) through the central opening (920) via the bottom surface (942) and exits through the top surface (944). Further, as shown in FIG. 9, the fluid path (924) between the central fin(s) (922) and the fin field (not shown), as well as the bottom cutout (960) and top cutout (970) allows for optimal fluid path.

Figure 10:
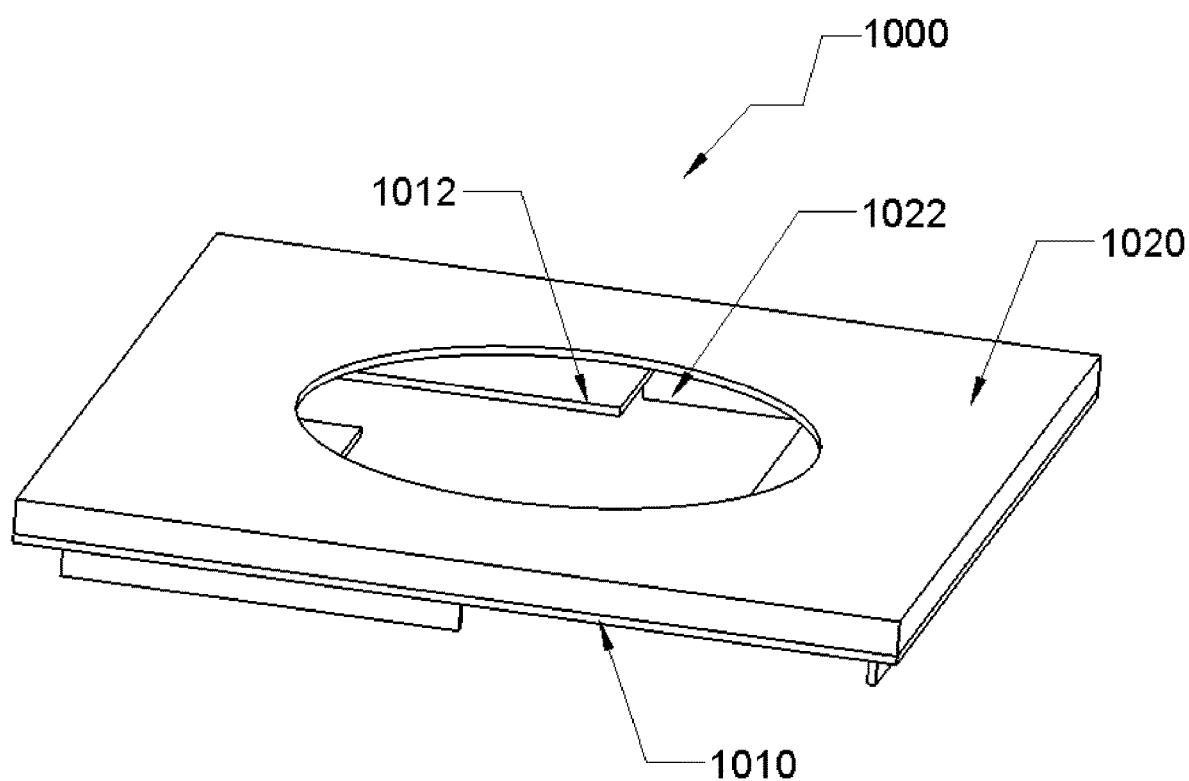
FIG. 10 depicts a top perspective view of a plenum assembly.

FIG. 10 is a top perspective view of a plenum (1000) with at least one cut-out, also known as an aperture. In one embodiment, the cut-out is sized to receive a fan. The plenum (1000) includes a bottom plate (1010) and a top plate (1020). The bottom plate (1010) and top plate (1020) communicate to form the plenum (1000). Both the top plate (1020) and the bottom plate (1010) comprise cut-outs (1022) and (1012), respectively. The top plate (1020) includes cut-out (1022) for the fluid-mover inlet. The bottom plate (1010) includes cut-out (1012) for fluid extraction. In one embodiment, the cut-out (1022) for the top plate (1020) is circular. The shape of the cut-out (1022) for the top plate (1020) may take any shape that supports fluid flow to the blower. The cut-out shape (1012) for the bottom plate (1010) may take one of several shapes, discussed below. The configuration of the bottom cutout (1012) and the top cutout (1022) supports heat sink functionality. The cut-out is shown herein separate from the fin field, which in one embodiment, is formed as an integral part of the fin field.

Figure 11:
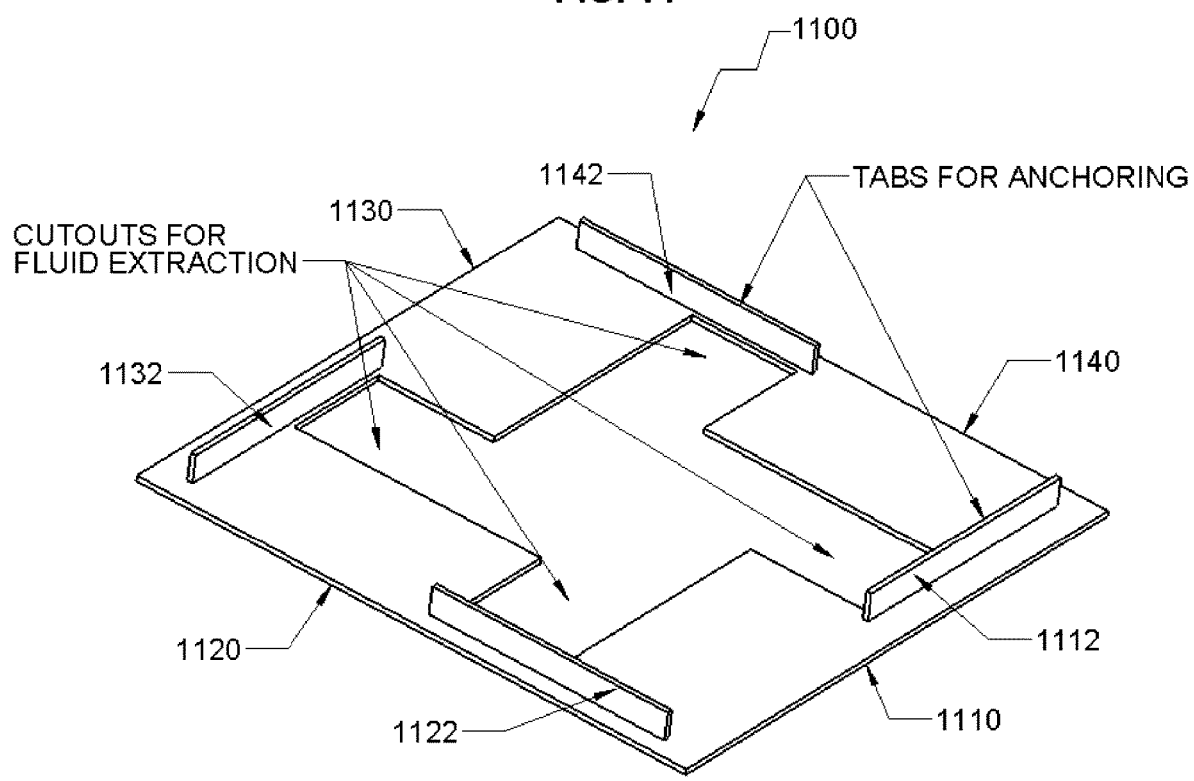
FIG. 11 depicts a top view of the bottom plate of a plenum.
Figure 12A:
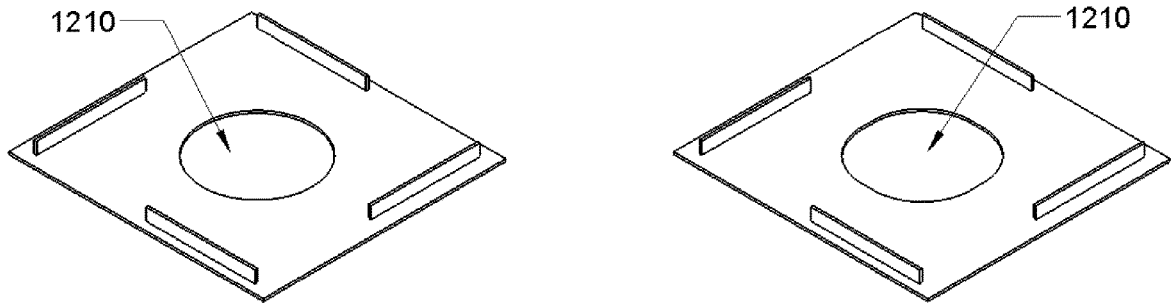
FIGS. 12A-D depict top views of alternative embodiments of bottom plates with one or more openings for fluid extraction.
Figure 12B:
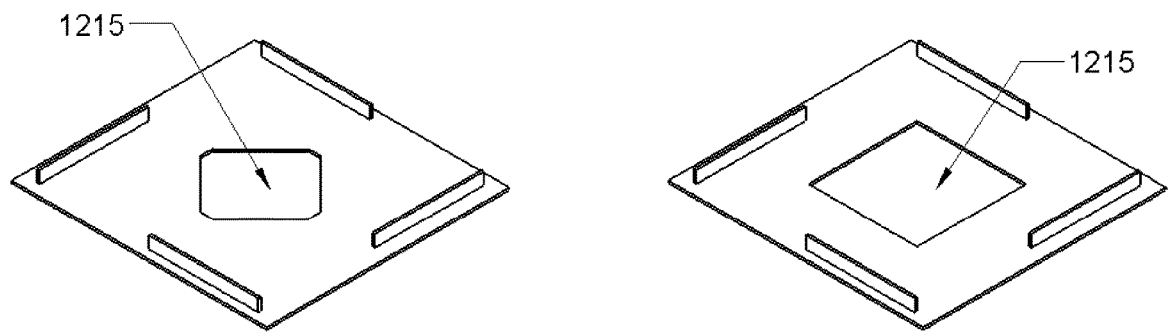
Figure 12C:
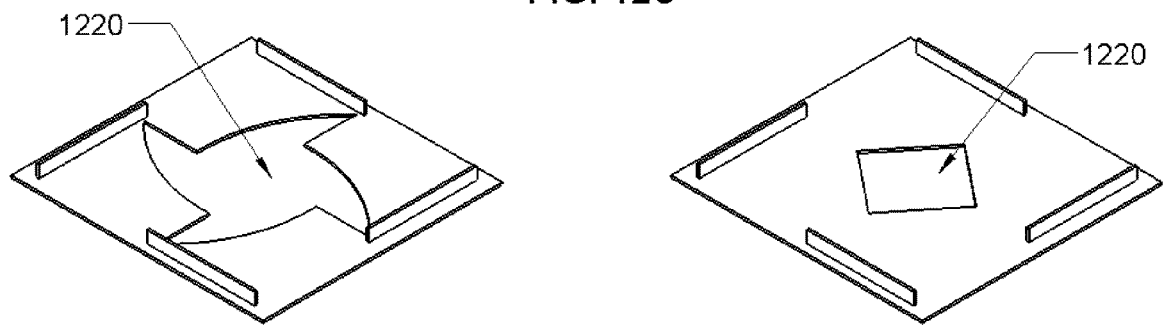
Figure 12D:
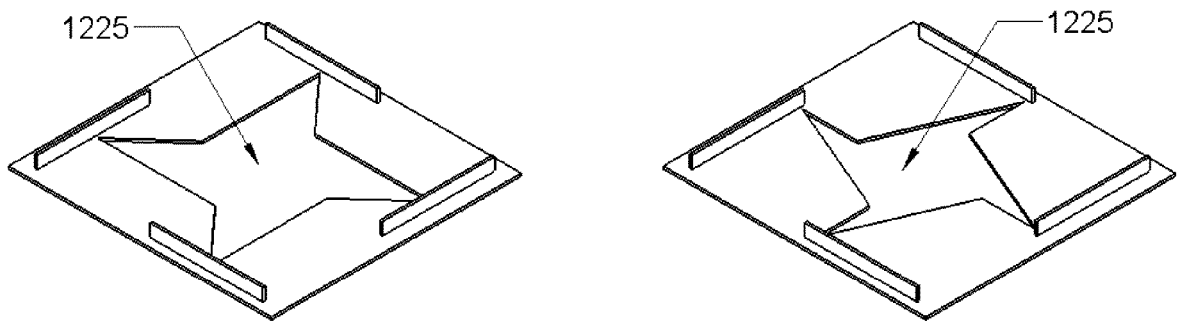

FIG. 11 is a top view of the bottom plate (1100) of a plenum. The bottom plate has four sides (1110), (1120), (1130), and (1140). Each of the sides is shown with a vertically extending fin. Specifically, side (1110) has a vertically extending fin (1112), side (1120) has a vertically extending fin (1122), side (1130) has a vertically extending fin (1132), and side (1140) has a vertically extending fin (1142). The fins, (1112), (1122), (1132), and (1142), are used to anchor the plenum to a heat sink. The bottom plate (1100) covers the top of the heat sink fins (not shown), and, in doing so, provides ducting.

FIGS. 12A-D are top views of alternative embodiments of bottom plates with cut outs. The bottom plate provides ducting, covering the top of the fins of the fin field of an associated heat sink. Cut-outs of different shapes are made in the central part of the plate for fluid extraction. Fluid from the heat sink enters the plenum through these openings and exits through an opening provided in the top plate. Embodiments of bottom plate cut-outs include, but are not limited to, circular (1210) shown in FIG. 12A, square (1215) shown in FIG. 12B, quadrilateral (1220) shown in FIG. 12C, and star (1225) shown in FIG. 12D. Additional shapes known in the art are contemplated and hereby incorporated by reference. As discussed above, the shape of the cutout for the bottom plate may take any shape that supports fluid extraction from the fin field (not shown) and via the central fin (not shown). In these exemplary views, the bottom plate includes the cut-outs for fluid extraction, which can take any of the shapes discussed herein or contemplated in the art. The shapes of the cut-outs shown herein should not be considered limiting. Accordingly, the shape of the cut-outs supports fluid movement through the heat sink by the blower.

FIG. 13 is a bottom view of a bottom plate of a plenum (1300) featuring mini-tabs. As shown, the bottom plate has four sides (1310), (1320), (1330), and (1340). Each of the sides is shown with a vertically extending fin. Specifically, side (1310) has a vertically extending fin (1312), side (1320) has a vertically extending fin (1322), side (1330) has a vertically extending fin (1332), and side (1340) has a vertically extending fin (1342). The fins, (1312), (1322), (1332), and (1342), are used to anchor the plenum to a heat sink. In one embodiment, the plenum is in intimate contact with the fin field shown FIG. 1, thereby creating a conduction path and provides additional surface area for heat transfer. In addition, the top heat sink ducting is ensured by mini-tabs protruding from the plenum plate (1350). In the embodiment shown herein, a first set of mini-tabs (1314) are provided adjacent to fin (1312) at side (1310), a second set of mini-tabs (1324) are provided adjacent to fin (1322), a third set of mini-tabs (1334) are provided adjacent to fin (1332), and a fourth set of mini-tabs (1344) are provided adjacent to fin (1342). Each of the sets of mini-tabs (1314), (1324), (1334), and (1344) protrude from the plenum plate (1350) towards an adjacently positioned heat sink. In one embodiment, the mini-tab sets intertwine with the heat sink fins (not shown) or are otherwise positioned adjacent to an associated fin field ensuring the top ducting needed for proper heat sink functioning.

Figure 14:
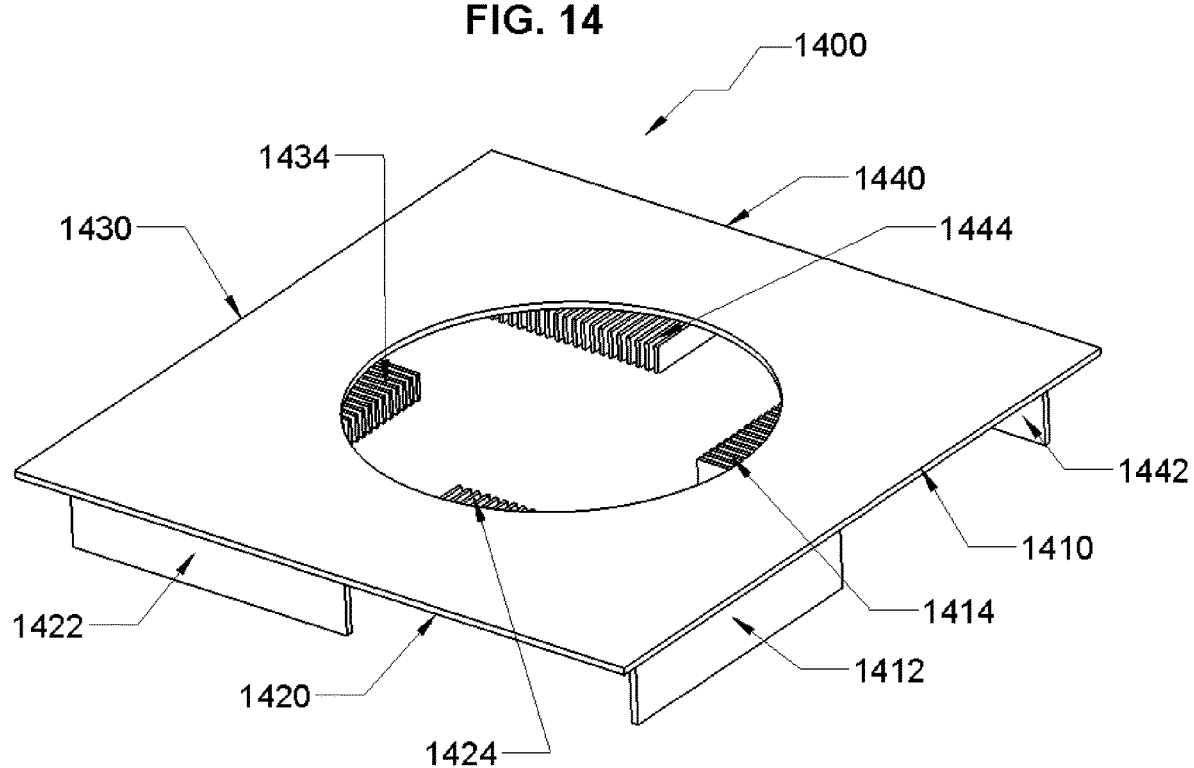
FIG. 14 depicts a top view of the plenum shown in FIG. 13.

Referring to FIG. 14, a top view of the plenum plate (1400) is shown. The plate includes a flat or relatively flat plate (1450) with an opening (1460) formed in a central area. In the embodiment shown herein, the opening (1460) has a circular shape, although this shape should not be considered limiting. Each side of the plate (1450) has a vertically extending exterior fin. Specifically, side (1410) has vertically extending fin (1412), side (1420) has vertically extending fin (1422), side (1430) has vertically extending fin (not shown), and side (1440) has vertically extending fin (1442). As shown from the bottom view in FIG. 13, a set of mini-tabs are provided adjacent to each fin, as shown through the opening (1460). Specifically, a first set of mini-tabs (1414) is provided adjacent to fin (1412), a second set of mini-tabs (1424) is provided adjacent to fin (1422), a third set of mini-tabs (1434) is provided adjacent to a fin (not shown), and a fourth set of mini-tabs (1444) is provided adjacent to fin (1442). The mini-tab sets intertwine with the heat sink fins (not shown) ensuring the top ducting needed for proper heat sink functioning.

As shown in the embodiments of FIGS. 13 and 14, the plenum is provided with sets of mini-tabs that intertwine with the heat sink fins. In one embodiment, the mini-tabs may be in different forms. As shown in FIG. 15, the mini-tabs (1500) may take the form of comb-like tines (1520) protruding from the plenum plate (1510). As with the plenum featuring mini-tabs described above, the protrusions (1520) intertwine with the heat sink fins (not shown) ensuring the top ducting needed for proper heat sink functioning.

Figure 16:
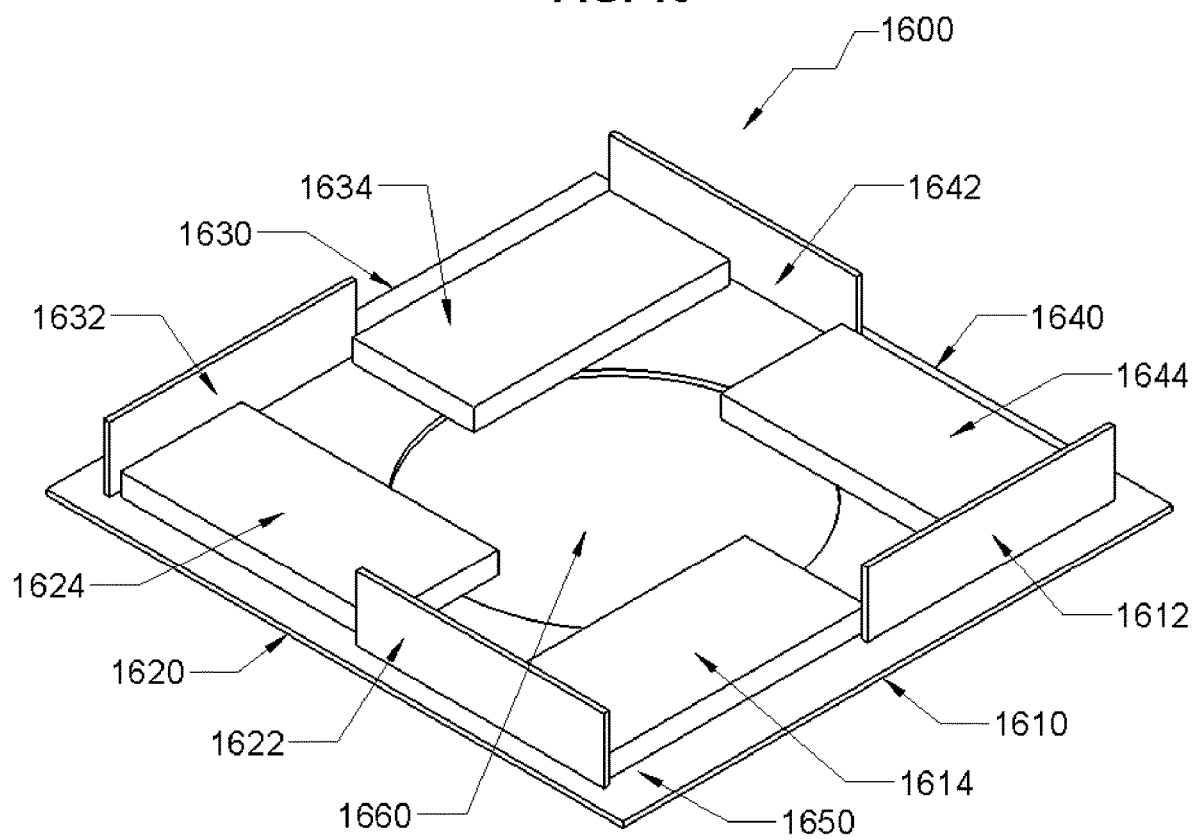
FIG. 16 depicts a top view of a plenum featuring one or more blocks.

Referring to FIG. 16, a bottom view of an alternative embodiment of the plenum (1600) is shown. The plate includes a flat or relatively flat plate (1650) with an opening (1660) formed in a central area. In the embodiment shown herein, the opening (1660) has a circular shape, although this shape should not be considered limiting. Each side of the plate (1650) has a vertically extending exterior fin. Specifically, side (1610) has vertically extending fin (1612), side (1620) has vertically extending fin (1622), side (1630) has vertically extending fin (1632), and side (1640) has vertically extending fin (1642). As shown from the bottom view in FIG. 15, each side of the plenum plate has a solid block adjacent to each fin. Specifically, a first block (1614) is provided adjacent to fin (1612), a second block (1624) is provided adjacent to fin (1622), a third block (1634) is provided adjacent to fin (1632), and a fourth block (1644) is provided adjacent to fin (1642). The blocks are positioned adjacent to the heat sink fins (not shown) ensuring the top ducting needed for proper heat sink functioning.

Figure 17:
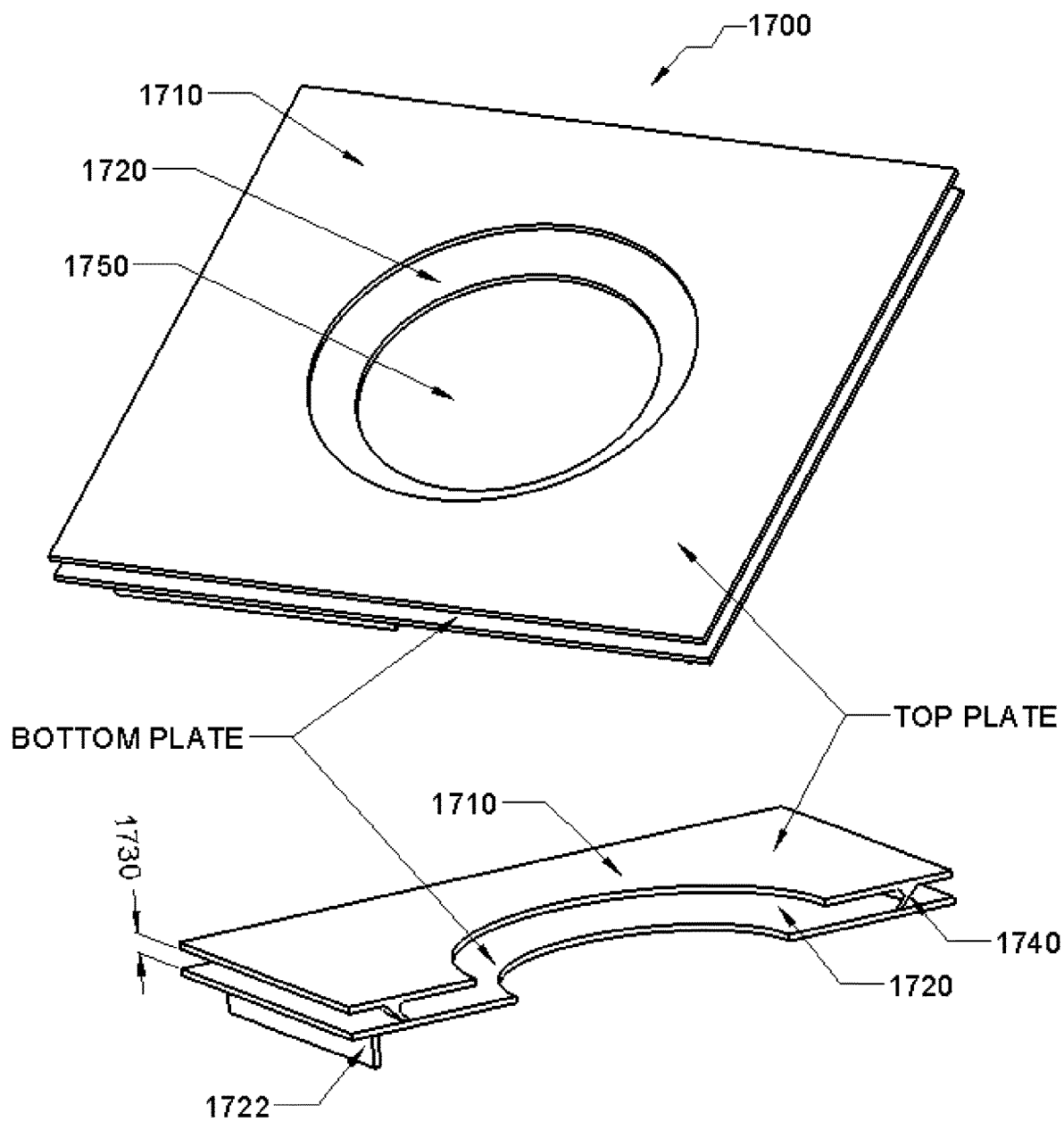
FIG. 17 depicts a top view of a plenum showing a funnel for fluid extraction.

Referring to FIG. 17, a top view of an embodiment of the plenum (1700) comprising a funnel is provided. To form the funnel, the plenum (1700) comprises two plates, a top plate (1710) and a bottom plate (1720). The two plates, (1710) and (1720), are spaced a distance (1730). The top plate (1710) and the bottom plate (1720) are in communication, such that the top plate (1710) and the bottom plate (1720) form a funnel shape plenum. More specifically, an angled interior wall (1740) is provided adjacent to the opening (1750) to provide the funnel. As shown, the plenum is anchored to the heat sink via fin (1722). Accordingly, the bottom plate (1720) provides the ducting and covers a select area of the heat sink fin field (not shown).

As discussed herein above, FIGS. 9-17 present alternative embodiments of a plenum. Common to each plenum embodiment is at least a flat bottom plate and a tab to anchor the plenum to an adjacently positioned heat sink. In a one plate configuration, the plate may additionally include one or more sets of mini-tabs, comb tines, or solid blocks. In all embodiments, the flat plates, or, alternatively, the protrusions from the flat plate, are in communication with the heat sink fins of the present invention. Accordingly, the plenum, as presented herein or in alternative embodiments, creates a ducting wall in communication with and covering the heat sink, which is necessary to flow fluid properly from the heat sink fins to the blower fluid inlet.

Alternative Embodiment(s)

It will be appreciated that, although specific embodiments of the invention have been described herein for purposes of illustration, various modifications may be made without departing from the spirit and scope of the invention. Accordingly, the scope of protection of this invention is limited only by the following claims and their equivalents.

The invention claimed is:

1. An apparatus comprising:
 a base having a perimeter with a first base edge and an opposite second base edge;
 a flow barrier extending from the base and comprising: opposite first and second barrier sides facing and spaced from the first and second base edges, respectively, a barrier length parallel to the first and second barrier sides, a barrier height perpendicular to the barrier length and to the base, and a relatively uniform barrier thickness between the first and second barrier sides and perpendicular to the barrier length and the barrier height;
 a first fin field positioned between the first base edge and the first barrier side, the first fin field comprising a plurality of first fins extending from the base and each having a respective first fin length extending parallel to the base and a respective first fin thickness that is perpendicular to the first fin length and less than the barrier thickness, the first fins collectively providing:
- a first fin sub-section that is positioned distal to the flow barrier, the first fin sub-section having a first fin sub-section height that is perpendicular to the first fin length and the first fin thickness and that is substantially equal to the barrier height; and
- a second fin sub-section that is proximate to the flow barrier, the second fin sub-section having a second fin sub-section height that is perpendicular to the first fin length and the first fin thickness and that is less than the first fin sub-section height and the barrier height; and a second fin field separated from the first fin field by the flow barrier and positioned between the second base edge and the second barrier side, the second fin field comprising a plurality of second fins extending from the base and each having a respective second fin length extending parallel to the base and a respective second fin thickness that is perpendicular to the second fin length and less than the barrier thickness, wherein the flow barrier is configured and arranged to prevent a fluid flow mix across the first and second fin fields.

2. The apparatus of claim 1, wherein the first flow barrier is formed as an integral part of the base.

3. The apparatus of claim 1, wherein the flow barrier extends linearly across the base from a third base edge to an opposite fourth base edge.

4. The apparatus of claim 1, wherein the first fins extend in length perpendicular to the barrier length and have first ends proximate to and physically spaced from the flow barrier by a gap.

5. The apparatus of claim 1, wherein the flow barrier is centrally located between the first and second base edges.

6. The apparatus of claim 1, wherein the second fin sub-section of the first fins extends lengthwise along substantially an entirety of the barrier length.

7. The apparatus of claim 1, wherein the first fin field further comprises an external fin extending from the base and having a length parallel to the first fins, the external fin having a constant height over an entirety of the length of the external fin, the constant height of the external fin being substantially equal to the first fin sub-section height.

8. The apparatus of claim 1, further comprising a cover plate oppositely disposed with respect to the base, the cover plate comprising a vertical fin extending from the cover plate and having a length parallel to the first fins, the vertical fin having a constant height over an entirety of the length thereof, the constant height of the vertical fin being substantially equal to the first fin sub-section height.

9. The apparatus of claim 1, wherein the first fins extend in length perpendicular or oblique to the barrier length and have first ends proximate to and physically attached to the flow barrier.

10. The apparatus of claim 9, wherein the second fins extend in length perpendicular or oblique to the barrier length and have second ends proximate to and physically attached to the flow barrier.

11. An apparatus comprising:
- a base having a perimeter with a first base edge and an opposite second base edge;
- a flow barrier extending from the base and comprising opposite first and second barrier sides facing and spaced from the first and second base edges, respectively, a barrier length parallel to the first and second barrier sides, a barrier height perpendicular to the barrier length and to the base, and a relatively uniform barrier thickness between the first and second barrier sides and perpendicular to the barrier length and the barrier height;
- a first fin field positioned between the first base edge and the first barrier side, the first fin field comprising a plurality of first fins extending from the base and each having a respective first fin length extending parallel to the base and a respective first fin thickness that is perpendicular to the first fin length and less than the barrier thickness, the first fins collectively providing
  - a first fin sub-section that is positioned distal to the flow barrier, the first fin sub-section having a first fin sub-section height that is perpendicular to the first fin length and the first fin thickness and that is substantially equal to the barrier height; and
  - a second fin sub-section that is proximate to the flow barrier, the second fin sub-section having a second fin sub-section height that is perpendicular to the first fin length and the first fin thickness and that is less than the first fin sub-section height and the barrier height; and
- a second fin field separated from the first fin field by the flow barrier and positioned between the second base edge and the second barrier side, the second fin field comprising a plurality of second fins extending from the base and each having a respective second fin length extending parallel to the base and a respective second fin thickness that is perpendicular to the second fin length and less than the barrier thickness, the second fins collectively providing
  - a third fin sub-section that is positioned distal to the flow barrier, the third fin sub-section having a third fin sub-section height that is perpendicular to the second fin length and the second fin thickness and that is substantially equal to the barrier height; and
  - a fourth fin sub-section that is proximate to the flow barrier, the fourth fin sub-section having a fourth fin sub-section height that is perpendicular to the second fin length and the second fin thickness and that is less than the third fin sub-section height and the barrier height wherein the flow barrier is configured and arranged to prevent a fluid flow mix across the first and second fin fields.

12. The apparatus of claim 11, wherein the first fins extend in length perpendicular or oblique to the barrier length.

13. An apparatus comprising:
- a base having a perimeter with opposite first and second base edges and opposite third and fourth base edges; and
- a first flow barrier extending from the base and comprising opposite first and second barrier sides facing and spaced from the first and second base edges, respectively, a first barrier length parallel to the first and second barrier sides, a first barrier height perpendicular to the first barrier length and to the base, and a relatively uniform first barrier thickness between the first and second barrier sides and perpendicular to the first barrier length and the first barrier height;
- a second flow barrier extending from the base and comprising opposite third and fourth barrier sides facing and spaced from the opposite third and fourth base edges, respectively, a second barrier length parallel to the third and fourth barrier sides, a second barrier height perpendicular to the second barrier length and to the base, and a relatively uniform second barrier thickness between the first and second barrier ends and perpendicular to the second barrier length and the second barrier height, the second flow barrier perpendicularly intersecting the first flow barrier;

a first fin field positioned between the first base edge and the first barrier side, the first fin field comprising a plurality of first fins extending from the base and each having a respective first fin length extending parallel to the base and a respective first fin thickness that is perpendicular to the first fin length and less than the first barrier thickness, the first fins collectively providing a first fin sub-section that is positioned distal to the first flow barrier, the first fin sub-section having a first fin sub-section height that is perpendicular to the first fin length and the first fin thickness and that is substantially equal to the first barrier height; and a second fin sub-section that is proximate to the first flow barrier, the second fin sub-section having a second fin sub-section height that is perpendicular to the first fin length and the first fin thickness and that is less than the first fin sub-section height and the first barrier height; and a second fin field separated from the first fin field by the first flow barrier and positioned between the second base edge and the second barrier side, the second fin field comprising a plurality of second fins extending from the base and each having a respective second fin length extending parallel to the base and a respective second fin thickness that is perpendicular to the second fin length and less than the first barrier thickness, wherein the first and second flow barriers are configured and arranged to prevent a fluid flow mix across the first and second fin fields.

14. The apparatus of claim 13, wherein the first and second flow barriers are formed as an integral part of the base.

15. The apparatus of claim 13, wherein the second fins collectively provide:

a third fin sub-section that is positioned distal to the second flow barrier, the third fin sub-section having a third fin sub-section height that is perpendicular to the second fin length and the second fin thickness and that is substantially equal to the barrier height; and a fourth fin sub-section that is proximate to the second flow barrier, the fourth fin sub-section having a fourth fin sub-section height that is perpendicular to the second fin length and the second fin thickness and that is less than the third fin sub-section height and the second barrier height.

16. The apparatus of claim 13, wherein:

the first fins extend in length perpendicular or oblique to the first barrier length and have first ends proximate to and physically attached to the first flow barrier; and the second fins extend in length perpendicular to the second barrier length and have second ends proximate to and physically attached to the second flow barrier.

17. The apparatus of claim 13, wherein the first fins extend in length perpendicular to the first barrier length and have first ends proximate to and physically spaced from the first flow barrier by a gap.

18. The apparatus of claim 13, wherein the first flow barrier is centrally located between the first and second base edges.

19. The apparatus of claim 13, wherein the first fin field further comprises an external fin extending from the base and having a length parallel to the first fins, the external fin having a constant height over an entirety of the length of the external fin, the constant height of the external fin being substantially equal to the first fin sub-section height.

20. The apparatus of claim 13, further comprising a cover plate oppositely disposed with respect to the base, the cover plate comprising a vertical fin extending from the cover plate and having a length parallel to the first fins, the vertical fin having a constant height over an entirety of the length thereof, the constant height of the vertical fin being substantially equal to the first fin sub-section height.

* * * * *